United States Patent [19]

Williams et al.

[11] Patent Number: 4,890,146

[45] Date of Patent: Dec. 26, 1989

[54] HIGH VOLTAGE LEVEL SHIFT SEMICONDUCTOR DEVICE

[75] Inventors: Richard K. Williams, Cupertino; Steven H. Bolger; Duane J. Rothacher, both of San Jose, all of Calif.

[73] Assignee: Siliconix Incorporated, Santa Clara, Calif.

[21] Appl. No.: 133,710

[22] Filed: Dec. 16, 1987

[51] Int. Cl.$^4$ .................... H01L 27/04; H01L 29/78
[52] U.S. Cl. ................................ 357/23.8; 357/23.4; 357/42; 357/51
[58] Field of Search .................... 357/23.4, 23.8, 51, 357/42, 46

[56] References Cited

U.S. PATENT DOCUMENTS

| | | | |
|---|---|---|---|
| 4,172,260 | 10/1979 | Okabe et al. | 357/23.8 |
| 4,292,642 | 9/1981 | Appels et al. | 357/23.8 |
| 4,300,150 | 11/1981 | Colak | 357/23.8 |
| 4,766,474 | 8/1988 | Nakagawa et al. | 357/23.8 |

OTHER PUBLICATIONS

Paper entitled "Power Integrated Circuits-A Brief Overview", B. Jayant Baliga, IEEE Transactions on Electron Devices, vol. ED-33, No. 12, Dec. 1986, pp. 1936-1939.
Paper entitled "Avalanche Breakdown in High-Voltage D-MOS Devices", by Michel J. Declercq et al., IEEE Transactions on Electron Devices, vol. ED-23, No. 1, Jan. 1986, pp. 1-4.
Article entitled "Modeling of the On-Resistance of LDMOS, VDMOS, and VMOS Power Transistors", by S. C. Sun et al., IEEE Transactions on Electron Devices, vol. ED-27, No. 2, Feb. 1980, pp. 356-367.
Article entitled "Modeling and Process Implementation of Implanted Resurf Type Devices", by E. J. Wildi et al., 1982 International Electron Device Meeting, paper 10.7, pp. 268-271.
Paper entitled "Effects of Drift Region Parameters on the Static Properties of Power LDMOST", by Sel Colak, IEEE Transactions on Electron Devices, vol. ED-29, No. 12, Dec. 1981, pp. 1455-1466.
Paper entitled "High Voltage Thin Layer Devices (RESURF Devices)", by J. A. Appels et al., International Electron Device Meeting Technical Digest, Dec. 1979, paper 10.1, pp. 238-241.

Primary Examiner—William D. Larkins
Attorney, Agent, or Firm—Skjerven, Morrill, MacPherson, Franklin & Friel

[57] ABSTRACT

Disclosed is a semiconductor device implementing a resistor-load level shift circuit which avoids high voltage crossings of PN junctions by utilization of a combined drain resistor region and a unique circuit layout.

41 Claims, 9 Drawing Sheets

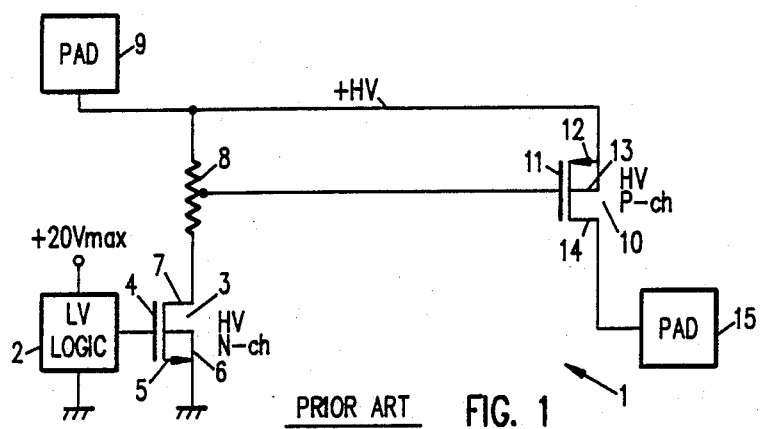
PRIOR ART FIG. 1
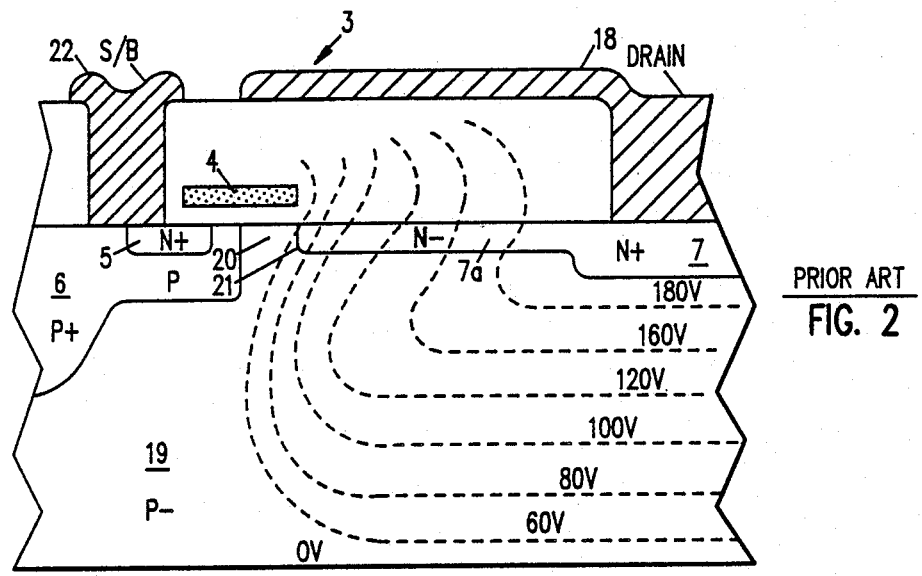
PRIOR ART FIG. 2
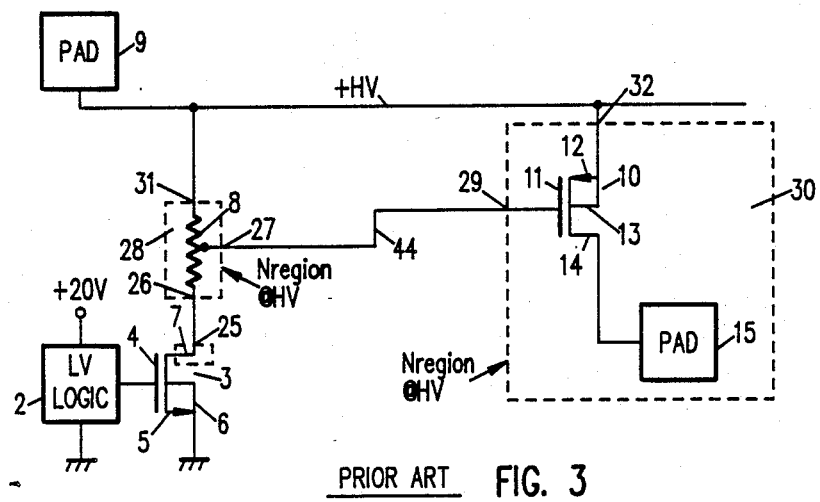
PRIOR ART FIG. 3

HIGH VOLTAGE LEVEL SHIFT SEMICONDUCTOR DEVICE

BACKGROUND OF THE INVENTION

1. Field of the Invention

This invention relates to high voltage integrated circuit semiconductor devices and more particularly to level shift high voltage semiconductor devices.

2. Description of Prior Art

In high voltage integrated circuits (HVIC) it is desirable to utilize high voltage push-pull output circuits. Further, when the device sourcing current is an N-channel or P-channel MOS transistor in a HVIC, the gate of the device must be driven on and off relative to this high voltage supply. For example, a P-channel device can be turned on by pulling its gate 20 volts below its source. If a 200 volt supply is used, the gate would be pulled down to 180v Similarly, it can be turned off by taking the gate potential to the 200 volt supply potential. The control signals normally available for turning devices on and off are referenced to ground and vary between 0 to 20 volts (or in some cases between 0 and 5 volts). It will quickly be appreciated that in order to turn a device "on" and "off", such as the P-channel device noted above, it will be necessary to produce high voltages from the above-noted normally available relatively low control voltages. The circuit which performs this function is known as a high voltage level shifter. This may be done in several ways, either through a high voltage cross-coupled pair or a high voltage resistor-load inverter circuit. A typical prior art high voltage resistor-load inverter circuit is illustrated in FIG. 1. Referring to FIG. 1, resistor-load inverter circuit 1 includes low voltage logic input circuit 2, depicted in FIG. 1 in block form, having a range of potential from 0 to 20 volts in this circuit, but as noted above, a control signal of from 0 to 5 volts may be used in some circumstances. Logic circuit 2 is utilized to turn "on" and "off" high voltage N-channel transistor 3. Transistor 3 includes gate 4, which receives control signals from logic input circuit 2, source 5 which is connected to body 6, both of which are commonly connected to ground and drain 7 which is connected to the lower side of resistor 8. The upper side of resistor 8 is connected to a positive high voltage line, which would typically be between 100 volts and 500 volts, obtained from supply from pad 9. To complete circuit 1, high voltage P-channel transistor 10 is included having its gate 11 connected to a tap (unnumbered) of resistor 8, its source 12 and body 13, which are commonly connected, which are tied to the positive high voltage supply. Transistor 10 also includes drain 14 which is connected to output pad 15. As mentioned above, it is desired to turn device 10 "on" and "off" which requires bringing gate 11 to approximately 20 volts below the potential on the +HV line to turn device 10 "on", and returning gate 11 to the +HV volt supply potential to turn device 10 "off". Shifting gate 11 of device 10 between the above-mentioned voltages is accomplished by appropriate control signals to gate 4 of device 3 to turn device 3 "on" and "off" changing the potential at the tap of resistor 8, causing the potential on gate 11 to shift between the +HV supply potential when device 3 is "off" and to drop to approximately 20 volts below the +HV supply potential when device 3 is "on". Although the P-channel device in circuit 1 is shown as an MOS transistor, such a circuit may also be implemented using a PNP bipolar transistor instead of transistor 10, however the circuitry may be different.

To implement high voltage level shift circuit 1 monolithically, metal interconnects must cross high-voltage PN junctions. When a metal interconnect crosses a high voltage PN junction, it concentrates electric fields which can lead to breakdown at the junction. Techniques are available to field plate the high voltage junction to alleviate the problems caused by a high voltage interconnect crossing above the junction, but the field plate technique is increasingly difficult to implement at higher voltages and may be incompatible with certain wafer fabrication processes.

FIG. 2 illustrates the cross-section of a portion of a lightly doped drain of N-channel device 3 having source 5 and body 6 shorted by metallization 22 as described above with respect to circuit 1. Referring to FIG. 2, the reverse biased equipotentials are illustrated for the "off" state condition. More particularly, it will be noted that since drain 7 is connected via metallization 18 to high voltage (through resistor 8, not shown), equipotential lines varying from 0 volts to 180 volts are distributed across substrate 19 and pose a crowding problem in region 20 where the equipotential lines converge near the lightly doped end of drain extension 7a. With the converging of these lines at junction 21 (the PN junction between substrate 19 and drain extension 7a) the likelihood of breakdown in this region is dramatically increased.

Implementing circuit 1 utilizing a self-isolated high voltage integrated circuit process will result in at least four high-voltage interconnect points which will occur on the topography required to monolithically implement circuit 1. The term "self-isolated" is used because, with respect to FIG. 2 for example, drain 7 forms back-to-back diodes with the drain of any adjacent N-channel device. FIGS. 3 and 4 (which will be described after FIG. 3) show a typical implementation of circuit 1. Referring to FIG. 3, these interconnect points are illustrated on the schematic by including dashed lines representing N-well regions 28 and 30, and more specifically include point 25, which is the high voltage crossing of metallization 18 to drain 7 of N-channel transistor 3; point 26 where metallization 18 crosses the P substrate (which is below metallization 18) leading to the junction with resistor 8; point 27 where metallization 44 crosses into N-well 28 to the tap point (unnumbered) of resistor 8; and point 29 where metallization 44 crosses the PN junction to reach N-well region 30 where metallization 44 connects to gate 11 of P-channel transistor 10. The P-channel device may be self-isolated in an N-well region or be a DMOS device with N+isolation region, in which case there will be a high voltage crossing of the N+isolation region. In addition, if the high voltage supply bonding pad 9 is not located inside N-well region 28, high voltage crossing point 31 will be encountered, and similarly, if the high voltage crossing to source 12/body 13 connection on P-channel device 10 is outside of region 30, high voltage crossing point 32 will also occur.

Referring to FIG. 4, there is illustrated in a top plan view the typical topography used to layout prior art circuit 1. Common ground bus 34 runs along the lower edge of cell 35 and is connected to body 6 and source 5 of N-channel device 3 at connection points 36 and 37, respectively, and is also connected to logic block 2. Via metallization 38, logic block 2 is connected to gate 4 of N-channel device 3. Bus 39 connects drain 7 to a connection point 40 of resistor 8 in circuit 1. It will be appreciated that with these connections, crossing points 25 and 26 (indicated in FIG. 4 by dashed lines to denote the regionlike nature of the crossing points) are encountered. As is well known in the prior art, resistor 8 is fabricated through the use of N-well regions 28a and 28b, which are located within guard ring 41 of highly P-doped material. Regions 28a and 28b may be formed, for example, by a diffusion process and would be N-doped regions in P-type substrate 19. Contact points 42 and 43 connect metallization 44 to regions 28a and 28b and form the tap connection to resistor 8. Bus 44 continues above substrate 19 and crosses above the junction between substrate 19 and N region 30, and connects to gate 11 of P channel device 10. This routing of metallization 44 results in crossing point 27 and crossing point 29. Positive high voltage bus 45 provides connection to region 28b of resistor 8 and results in crossing point 31 and 31'. Crossing point 32 from high voltage pad 9 into N-well region 30 may also be noted by reference to FIG. 4.

Also illustrated in FIG. 4 is body region 13 of P-channel device 10, source region 12, both of which are connected via contact points 46 and 47, respectively to high voltage bus 45. From the foregoing, it will be appreciated that with the prior art circuit numerous problem crossing points are encountered where a high voltage crosses a PN junction in the typical prior art layout as illustrated in FIG. 4.

SUMMARY OF THE INVENTION

It is an object of our invention to produce a high voltage level shift semiconductor device which avoids the problems of the prior art illustrated above and which may be easily fabricated.

In accordance with our invention, we provide a semiconductor device comprising a substrate of first conductivity type, a body region of first conductivity type extending into said substrate from a surface, said body region having a doping level greater than the doping level of said substrate, a source region of second conductivity type extending into said body region from said surface to a depth less than said body region extends into said substrate, a combined drain resistor region of second conductivity type extending into said substrate from said surface and being positioned adjacent to said body region, said combined drain resistor region functioning as a drain region for said device and as a resistive region, a channel region in said substrate extending to said surface between said combined drain resistor region and said body region, a channel region in said body region extending to said surface between said source region and said channel region in said substrate, an insulating material on said surface and extending from said source region to said combined drain resistor region, a gate on said insulating material, said gate being positioned above said channel region in said body region and said channel region in said substrate.

In accordance with another feature of our invention, we provide a semiconductor device as set forth above in which the combined drain resistor region includes a first portion, adjacent to the channel region in the substrate, which extends into the substrate to a first depth and a second portion away from said channel region which extends into the substrate to a second depth greater than the first depth.

As yet another feature of our invention we have provided a device in accordance with the two above-mentioned features which also includes a source region of first conductivity type extending into said second portion of said combined drain resistor region from said surface, a drain region of first conductivity type extending into said second portion of said combined drain resistor region from said surface and being positioned adjacent to said source region of first conductivity type, a channel region in said second portion of said combined drain resistor region extending to said surface between said source region of first conductivity type and said drain region of first conductivity type, an insulating material on said surface above said channel region in said second portion of said combined drain resistor region, and a gate on said insulating material above said channel region in said second portion of said combined drain resistor region.

As a further feature of our invention, we provide a device in accordance with the foregoing features and also provide such device with a first contact region of second conductivity type extending into said second portion of said combined drain resistor region from said surface and means electrically connecting said first contact region to said gate positioned above said channel region in said second portion of said combined drain resistor region.

In accordance with another feature of our invention we provide a semiconductor device comprising a substrate of first conductivity type, an epitaxial layer of material of first conductivity type on said substrate, a body region of first conductivity type extending into said epitaxial layer from a surface, said body region having a doping level greater than the doping level of said epitaxial layer, a source region of second conductivity type extending into said body region from said surface to a depth less than said body region extends into said epitaxial layer, a combined drain resistor region of second conductivity type extending into said epitaxial layer from said surface and being positioned adjacent to said body region, said combined drain resistor region functioning as a drain region for said device and as a resistive region, a channel region in said epitaxial layer extending to said surface between said combined drain resistor region and said body region, a channel region in said body region extending to said surface between said source region and said channel region in said epitaxial layer, an insulating material on said surface extending from said source region to said combined drain resistor region, a first gate on said insulating material, said first gate being positioned above said channel region in said body region and said channel region in said epitaxial layer, a first isolation region of second conductivity type extending from said surface through said combined drain resistor region and into said epitaxial layer, a buried layer of second conductivity type positioned below said first isolation region, a second isolation region of second conductivity type extending from said buried layer to and merging with said first isolation region thereby forming a drain region in said epitaxial layer surrounded by said buried layer and said first and second isolation regions, a source region of first conductivity type extending from said surface into the portion of said combined drain resistor region surrounded by said first isolation region, said source region being positioned adjacent to one edge of said combined drain resistor region, a channel region extending to said surface between said source region of first conductivity type and the adjacent edge of said combined drain resistor region, an insulating material on said surface above said channel region in said combined drain resistor region, and a second gate on said insulating material above said channel region in said combined drain resistor region.

In accordance with yet another feature of our invention, we provide a device as set forth in the immediately preceding paragraph which includes a first contact region of second conductivity type extending into said combined drain resistor region from said surface and means electrically connecting said first contact region to said second gate.

In accordance with another feature of our invention, we provide a device as described in the first feature above which also includes in the combined drain resistor region a source region of first conductivity type extending into said combined drain resistor region from said surface, a drain region of first conductivity type extending into said combined drain resistor region from said surface and being positioned adjacent to said source region of first conductivity type, a channel region in said combined drain resistor region extending to said surface between said source region of first conductivity type in said drain region of first conductivity type, an insulating material on said surface above said channel region in said combined drain resistor region and a gate on said insulating material above said channel region in said combined drain resistor region.

In another feature of our invention we provide a device of the type immediately set forth above which includes a first contact region of second conductivity type in said combined drain resistor region and means electrically connecting said first contact region to said gate positioned above said channel region in said combined drain resistor region.

As yet a further feature of our invention, we provide a semiconductor device comprising a substrate of first conductivity type, an epitaxial layer of material of first conductivity type on said substrate, a body region of first conductivity type extending into said epitaxial layer from a surface, said body region having a doping level greater than the doping level of said epitaxial layer, a source region of second conductivity type extending into said body region from said surface to a depth less than said body region extends into said epitaxial layer, a combined drain resistor region of second conductivity type extending into said epitaxial layer from said surface and being positioned adjacent to said body region, said combined drain resistor region functioning as a drain region for said device and as a resistive region, a channel region in said epitaxial layer extending to said surface between said combined drain resistor region and said body region, a channel region in said body region extending to said surface between said source region and said channel region in said epitaxial layer, an insulating material on said surface extending from said source region to said combined drain resistor region, a first gate on said insulating material, said first gate being positioned above said channel region in said body region and said channel region in said epitaxial layer, a first isolation region of second conductivity type extending from said surface through said combined drain resistor region and into said epitaxial layer, a buried layer of second conductivity type positioned below said first isolation region, a second isolation region of second conductivity type extending from said buried layer to and merging with said first isolation region thereby forming a collector region in said epitaxial layer surrounded by said buried layer and said first and second isolation regions, a base region of second conductivity type extending into said collector region, an emitter region of first conductivity type extending into said base region, and a collector contact region of first conductivity type extending into said collector region.

In accordance with an additional feature of our invention, we provide a semiconductor device of the type set forth above having a bipolar transistor and include a first contact region of second conductivity type extending into said combined drain resistor region from said surface and means electrically connecting said first contact region to said base region of said bipolar transistor.

As yet another feature of our invention, we provide a semiconductor device comprising a substrate of first conductivity type; an epitaxial layer of material of first conductivity type on said substrate; a body region of first conductivity type extending into said epitaxial layer from a surface, said body region having a doping level greater than the doping level of said epitaxial layer; a source region of second conductivity type extending into said body region from said surface to a depth less than said body region extends into said epitaxial layer; a combined drain resistor region of second conductivity type extending into said epitaxial layer from said surface and being positioned adjacent to said body region, said combined drain resistor region functioning as a drain region for said device and as a resistive region; a channel region in said body region extending to said surface between said source region and said combined drain resistor region; an insulating material on said surface above said channel region in said body region; a first gate on said insulating material, said first gate being positioned above said channel region in said body region; a first isolation region of second conductivity type extending from said surface through said combined drain resistor region and into said epitaxial layer; a buried layer of second conductivity type positioned below said first isolation region; a second isolation region of second conductivity type extending from said buried layer to and merging with said first isolation region thereby forming a collector region in said epitaxial layer surrounded by said buried layer and said first and second isolation regions; a base region of second conductivity type extending into said collector region; an emitter region of first conductivity type extending into said base region; and a collector contact region of first conductivity type extending into said collector region.

As another feature of our invention, we provide a semiconductor device comprising a substrate of first conductivity type, an epitaxial layer of material of second conductivity type on said substrate, a body region of second conductivity type extending into said epitaxial layer from a surface, said body region having a doping level greater than the doping level of said epitaxial layer, a source region of first conductivity type extending into said body region from said surface to a depth less than said body region extends into said substrate, a combined drain resistor region of first conductivity type extending into said epitaxial layer from said surface and being positioned adjacent to said body region, said combined drain resistor region functioning as a drain region for said device and as a resistive region, a channel region in said epitaxial layer extending to said surface between said combined drain resistor region and said body region, a channel region in said body region extending to said surface between said source region and said channel region in said epitaxial layer, an insulating material on said surface and extending from said source region to said combined drain resistor region, a first gate on said insulating material, said gate being positioned above said channel region in said body region and said channel region in said epitaxial layer, a source region of second conductivity type extending into said combined drain resistor region from said surface, a drain region of second conductivity type extending into said epitaxial layer from said surface and being positioned adjacent to said source region of second conductivity type, a drain contact region of second conductivity type extending into said drain region of second conductivity type from said surface and being positioned adjacent to said combined drain resistor region, a drift region extending along said surface between said drain contact region and said combined drain resistor region, a channel region extending to said surface between said source region of second conductivity type and said drift region, an insulating material on said surface above said channel region in said combined drain resistor region, a second gate on said insulating material above said channel region in said combined drain resistor region, and an isolation region of first conductivity type extending from said surface of said epitaxial layer into said epitaxial layer to said substrate and surrounding said source region of second conductivity type, said drain region of second conductivity type, said drift region and said channel region which extends between said source region of second conductivity type and said drift region.

In accordance with another feature of our invention, we provide a device as set forth immediately above which includes a contact region of second conductivity type in said combined drain resistor region and means electrically connecting said contact region to said second gate.

In accordance with an additional feature of our invention, we provide a semiconductor device comprising a substrate of first conductivity type, an epitaxial layer of material of first conductivity type on said substrate, a body region of first conductivity type extending into said epitaxial layer from a surface, said body region having a doping level greater than the doping level of said epitaxial layer, a source region of second conductivity type extending into said body region from said surface to a depth less than said body region extends into said epitaxial layer, a combined drain resistor region of second conductivity type extending into said epitaxial layer from said surface and being positioned adjacent to said body region, said combined drain resistor region functioning as a drain region for said device and as a resistive region, a channel region in said body region extending to said surface between said source region and said combined drain resistor region, an insulating material on said surface above said channel region in said body region, a first gate on said insulating material, said first gate being positioned above said channel region in said body region, a first isolation region of second conductivity type extending from said surface through said combined drain resistor region and into said epitaxial layer, a buried layer of second conductivity type positioned below said first isolation region, a second isolation region of second conductivity type extending from said buried layer to and merging with said first isolation region thereby forming a drain region in said epitaxial layer surrounded by said buried layer and said first and second isolation regions, a source region of first conductivity type extending from said surface into the portion of said combined drain resistor region surrounded by said first isolation region, said source region being positioned adjacent to one edge of said combined drain resistor region, a channel region extending to said surface between said source region of first conductivity type and the adjacent edge of said combined drain resistor region, an insulating material on said surface above said channel region in said combined drain resistor region, and a second gate on said insulating material above said channel region in said combined drain resistor region.

In accordance with a further feature of our invention, we provide a semiconductor device comprising a substrate of first conductivity type, a first epitaxial layer of material of first conductivity type on said substrate, a second epitaxial layer of material of first conductivity type on said first epitaxial layer, a body region of first conductivity type extending into said second epitaxial layer from a surface, said body region having a doping level greater than the doping level of said second epitaxial layer, a source region of second conductivity type extending into said body region from said surface to a depth less than said body region extends into said second epitaxial layer, a combined drain resistor region of second conductivity type extending into said second epitaxial layer from said surface and being positioned adjacent to said body region, said combined drain resistor region functioning as a drain region for said device and as a resistive region, a channel region in said second epitaxial layer extending to said surface between said combined drain resistor region and said body region, a channel region in said body region extending to said surface between said source region and said channel region in said second epitaxial layer, an insulating material on said surface extending from said source region to said combined drain resistor region, a first gate on said insulating material, said first gate being positioned above said channel region in said body region and said channel region in said second epitaxial layer, a first isolation region of second conductivity type extending from said surface through said combined drain resistor region and into said second epitaxial layer, a buried layer of second conductivity type positioned below said first isolation region, said buried layer extending into said substrate and into said first epitaxial layer, a second isolation region of second conductivity type extending from said buried layer into said first epitaxial layer for a distance less than the thickness of said second epitaxial layer, a third isolation region of second conductivity type having a first portion extending into said first epitaxial layer and merging with said second isolation region and having a second portion extending into said second epitaxial layer and merging with said first isolation region, thereby forming a drain region in said first and second epitaxial layers bounded by said buried layer and said first, second and third isolation regions, a source region of first conductivity type extending from said surface into the portion of said combined drain resistor region surrounded by said first isolation region, said source region being positioned adjacent to one edge of said combined drain resistor region, a channel region extending to said surface between said source region of first conductivity type and the adjacent edge of said combined drain resistor region, an insulating material on said surface above said channel region in said combined drain resistor region, and a second gate on said insulating material above said channel region in said combined drain resistor region.

In accordance with another feature of our invention, we provide a semiconductor device comprising a substrate of first conductivity type, a first epitaxial layer of material of first conductivity type on said substrate, a second epitaxial layer of material of first conductivity type on said first epitaxial layer, a body region of first conductivity type extending into said second epitaxial layer from a surface, said body region having a doping level greater than the doping level of said second epitaxial layer, a source region of second conductivity type extending into said body region from said surface to a depth less than said body region extends into said second epitaxial layer, a combined drain resistor region of second conductivity type extending into said second epitaxial layer from said surface and being positioned adjacent to said body region, said combined drain resistor region functioning as a drain region for said device and as a resistive region, a channel region in said body region extending to said surface between said source region and said combined drain resistor region, an insulating material on said surface above said channel region in said body region, a first gate on said insulating material, said first gate being positioned above said channel region in said body region, a first isolation region of second conductivity type extending from said surface through said combined drain resistor region and into said second epitaxial layer, a buried layer of second conductivity type positioned below said first isolation region, said buried layer extending into said substrate and into said first epitaxial layer, a second isolation region of second conductivity type extending from said buried layer into said first epitaxial layer for a distance less than the thickness of said second epitaxial layer, a third isolation region of second conductivity type having a first portion extending into said first epitaxial layer and merging with said second isolation region and having a second portion extending into said second epitaxial layer and merging with said first isolation region, thereby forming a drain region in said first and second epitaxial layers bounded by said buried layer and said first, second and third isolation regions, a source region of first conductivity type extending from said surface into the portion of said combined drain resistor region surrounded by said first isolation region, said source region being positioned adjacent to one edge of said combined drain resistor region, a channel region extending to said surface between said source region of first conductivity type and the adjacent edge of said combined drain resistor region, an insulating material on said surface above said channel region in said combined drain resistor region, and a second gate on said insulating material above said channel region in said combined drain resistor region.

In accordance with yet another feature of our invention, we provide a semiconductor device comprising a substrate of first conductivity type; an epitaxial layer of material of second conductivity type on said substrate; an isolation region of first conductivity type extending from a surface of said epitaxial layer through said epitaxial layer to said substrate thereby forming a combined drain resistor region bounded by said isolation region; a body region of first conductivity type extending into said combined drain resistor region from a surface; a source region of second conductivity type extending into said body region from said surface to a depth less than said body region extends into said combined drain resistor region, said source region being positioned adjacent to said combined drain resistor region; a channel region in said body region extending to said surface between said source region and said combined drain resistor region; an insulating material on the surface of said combined drain resistor region; a first gate on said insulating material and positioned above said channel region in said body region; a source region of first conductivity type extending into said combined drain resistor region from said surface; a drain region of first conductivity type extending into said combined drain resistor region adjacent to said source region; a channel region in said combined drain resistor region and extending to said surface between said source region of first conductivity type and said drain region of first conductivity type; an insulating material on said surface above said channel region in said combined drain resistor region; a second gate on said insulating material above said channel region in said combined drain resistor region; a contact region of second conductivity type extending into said combined drain resistor region; and means electrically connecting said contact region and said second gate.

As yet a further feature of our invention, we provide a semiconductor device comprising a substrate of first conductivity type, an epitaxial layer of material of first conductivity type on said substrate, a body region of first conductivity type extending into said epitaxial layer from a surface, said body region having a doping level greater than the doping level of said epitaxial layer, a source region of second conductivity type extending into said body region from said surface to a depth less than said body region extends into said epitaxial layer, a combined drain resistor region of second conductivity type extending into said epitaxial layer from said surface and being positioned adjacent to said body region, said combined drain resistor region functioning as a drain region for said device and as a resistive region, a heavily doped buried layer of second conductivity type formed within said substrate and said epitaxial layer, a well region of second conductivity type formed within said substrate and said epitaxial layer and encompassing said buried layer, said well region extending into said epitaxial layer to a distance such that it merges with said combined drain resistor region, a channel region in said body region extending to said surface between said source region and said combined drain resistor region, an insulating material on said surface above said channel region in said body, a gate on said insulating material, said gate being positioned above said channel region in said body region.

In accordance with another feature of our invention, we provide a semiconductor device comprising a substrate of first conductivity type, a body region of first conductivity type extending into said substrate from a surface, said body region having a doping level greater than the doping level of said substrate, a source region of second conductivity type extending into said body region from said surface to a depth less than said body region extends into said substrate, a combined drain resistor region of second conductivity type extending into said substrate from said surface and being positioned adjacent to said body region, said combined drain resistor region functioning as a drain region for said device and as a resistive region, a channel region in said body region extending to said surface between said source region and said combined drain resistor region, an insulating material on said surface above said channel region in said body region, a gate on said insulating material, said gate being positioned above said channel region in said body region.

In accordance with a further feature of our invention, we provide a semiconductor device comprising a substrate of first conductivity type, an epitaxial layer of material of first conductivity type on said substrate, a body region of first conductivity type extending into said epitaxial layer from a surface, said body region having a doping level greater than the doping level of said epitaxial layer, a source region of second conductivity type extending into said body region from said surface to a depth less than said body region extends into said epitaxial layer, a combined drain resistor region of second conductivity type extending into said epitaxial layer from said surface and being positioned adjacent to said body region, said combined drain resistor region functioning as a drain region for said device and as a resistive region, a heavily doped buried layer of second conductivity type formed within said substrate and said epitaxial layer, a well region of second conductivity type formed within said substrate and said epitaxial layer and encompassing said buried layer, said well region extending into said epitaxial layer to a distance such that it merges with said combined drain resistor region, a channel region in said epitaxial layer extending to said surface between said combined drain resistor region and said body region, a channel region in said body region extending to said surface between said source region and said channel region in said epitaxial layer, an insulating material on said surface and extending from said source region to said combined drain resistor region, and a gate on said insulating material, said gate being positioned above said channel region in said body region and said channel region in said epitaxial layer.

BRIEF DESCRIPTION OF THE DRAWINGS

Other objects and advantages of our invent will become apparent from a study of a specification and drawings in which:

FIG. 1 shows a schematic of a prior art resistor-load inverter circuit;

FIG. 2 shows in cross section a portion of a prior art high voltage transistor illustrating equipotential crowding;

FIG. 3 is a circuit of the prior art illustrating high voltage crossing points;

DESCRIPTION OF THE PREFERRED EMBODIMENTS

Figure 4:
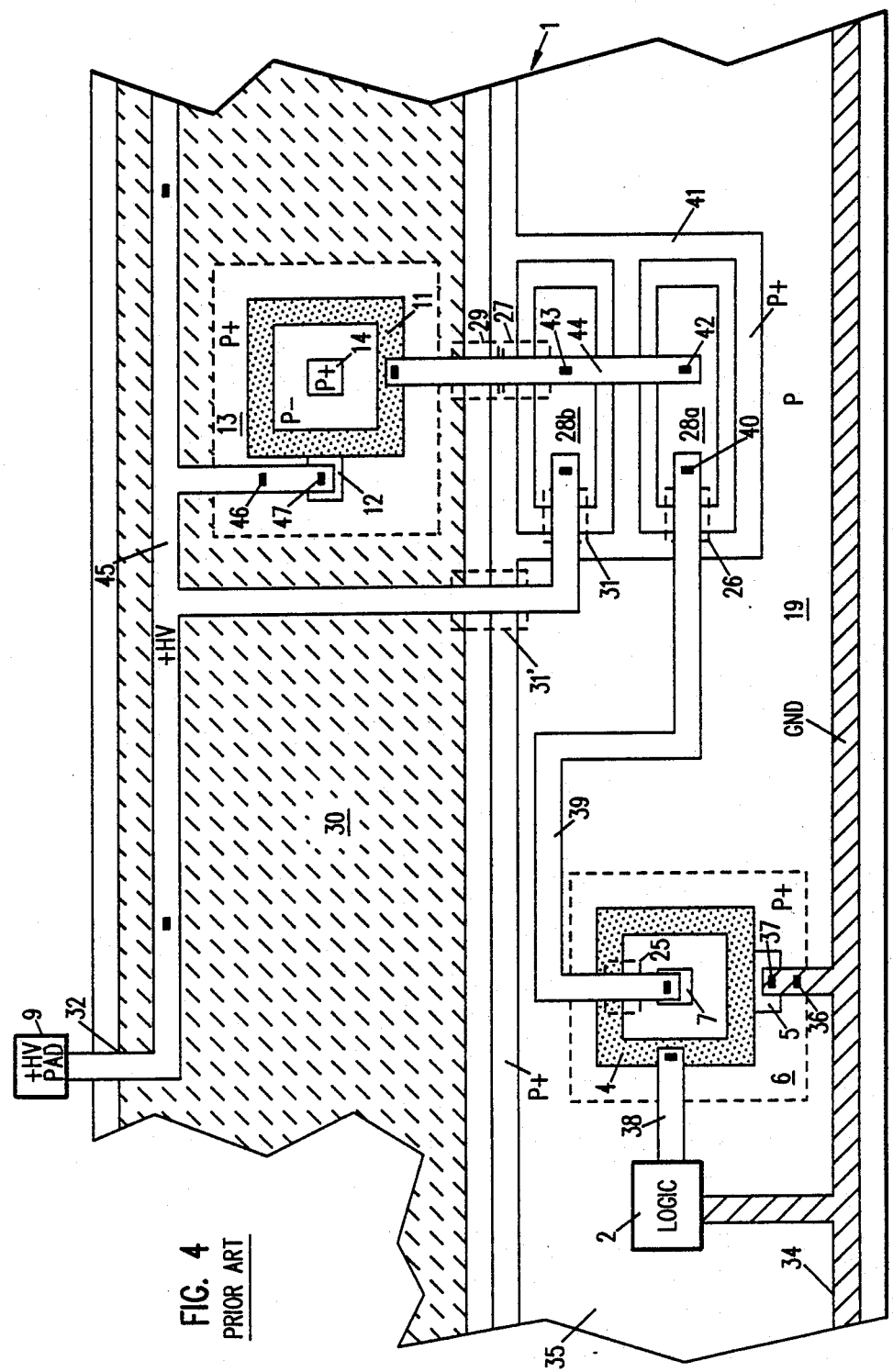
FIG. 4 is a top plan view showing the layout of a typical prior art device, illustrating high voltage crossings of PN junctions.
Figure 5:
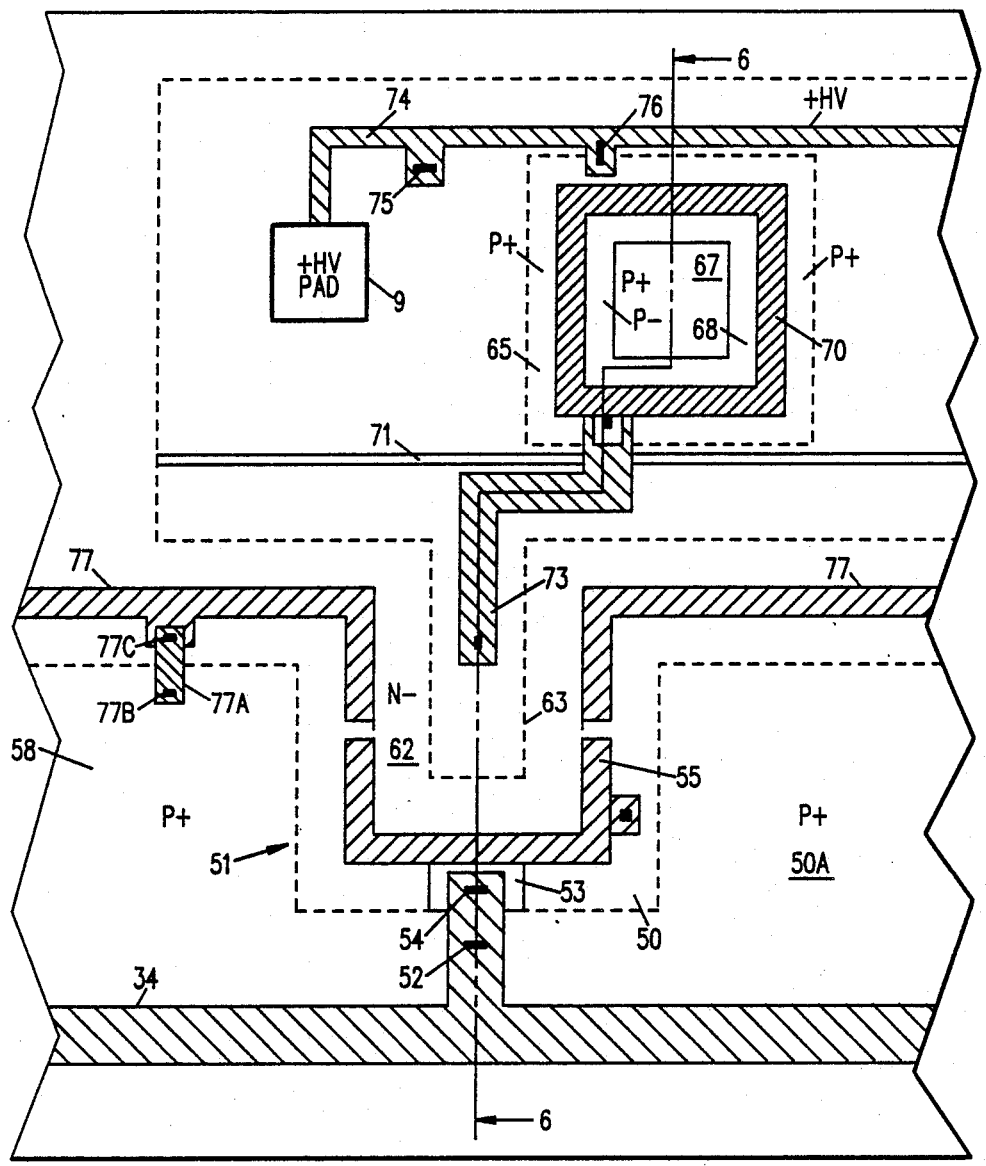
FIG. 5 is a top plan view of a cell of the first embodiment of our high voltage resistor load inverter device.
Figure 6:
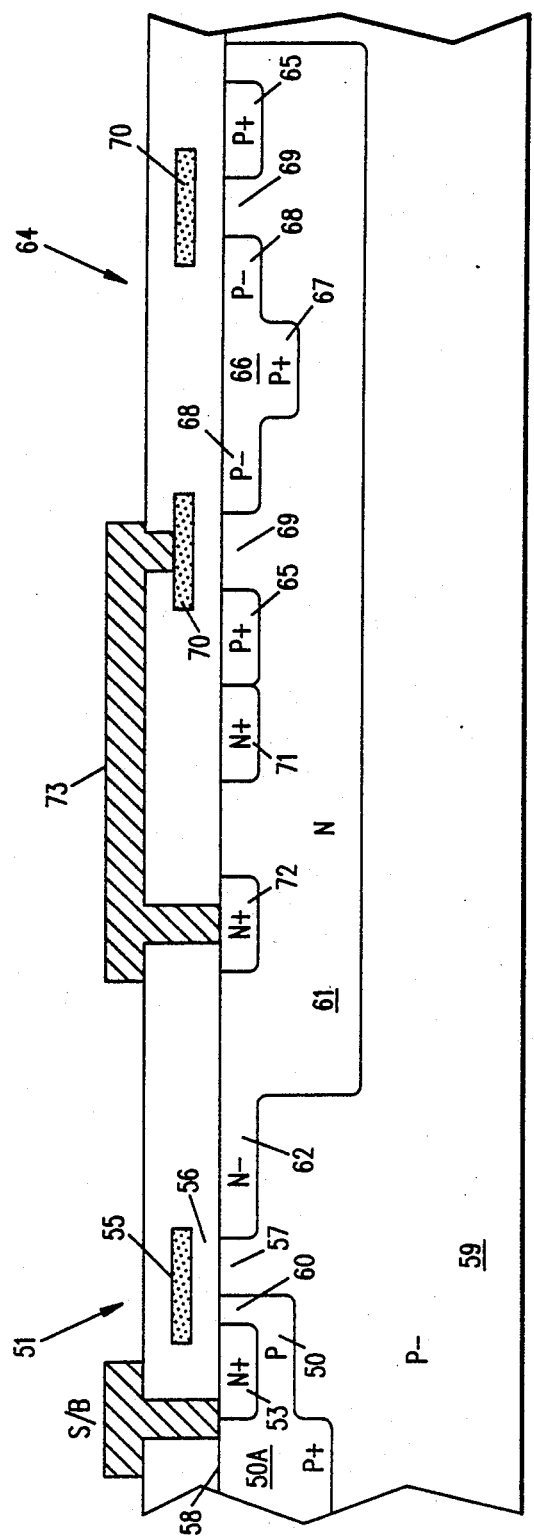
FIG. 6 is a cross section view of the device of FIG. 5 taken along lines 6—6 of FIG. 5.

A first embodiment of our invention is illustrated in FIG. 5 which shows the layout of one cell of a resistor-load inverter circuit having a schematic as shown in FIG. 1. A cross section of the cell of FIG. 5, taken along line 6—6, is illustrated in FIG. 6 as an aid to understanding our invention. FIG. 6 will be described in detail following an explanation of FIG. 5. Since our embodiment in FIG. 5 utilizes certain new regions, reference characters will not necessarily correspond to those used in the preceding Figures. As will be appreciated from the discussion which will follow, with the layout illustrated in FIG. 5 we have eliminated all high-voltage metal crossings in the circuit. Referring to FIG. 5, ground bus 34 is connected to body region 50 of N-channel transistor 51 via contact point 52 and ground bus 34 is also connected to source region 53 via contact 54, thus providing the conventional common connection between source and body regions of device 51. Source region 53 is heavily N-doped and is included within P body region 50, which can best be seen by reference to FIG. 6. Also, by reference to FIG. 6 it will be observed that device 51 includes heavily P-doped deep body region 50A, the function of which, and process for producing, are both well known to those skilled in the art. Viewing FIGS. 5 and 6 in combination will assist the reader in better understanding our invention and the explanation will flow more easily when these figures are viewed concurrently. Gate 55, which may be composed, for example, of polysilicon material, is positioned above insulating material 56 which may be, for example, silicon dioxide, and is positioned above channel region 57 in P-type substrate 59. It will be noted that channel region 57 in P-type substrate 59 extends to surface 58 and is positioned adjacent to channel region 60 in P body 50, which is formed by the varying diffusions of body region 50 and source region 53 into substrate 59. For the sake of simplicity, the electrical connection between logic 2 and gate 55 is not shown in our Figures. Our exemplary semiconductor device is accomplished through the provision of a combined drain resistor region 61 (best seen in FIG. 6) which includes a lightly N-doped portion 62 which extends to just below the right hand edge of gate 55. In FIG. 5, dashed line 63 indicates the approximate boundary of the deeper portion of combined drain resistor region 61. Lightly N-doped portion 62 of combined drain resistor region 61 extends into substrate 59 from surface 58 to a depth of approximately 1 to 4 μm and the deeper portion of combined drain resistor region 61 extends into substrate 59 from surface 58 to a depth of approximately 3 to 12 μm. For our first embodiment of the resistor load level shift circuit the P-channel device is indicated at 64 (see FIG. 6) and includes highly doped P-type source region 65, drain region 66 of P-type material, with heavily doped portion 67 extending deeper into combined drain resistor region 61 than the lightly doped portion 68 which is shallower than portion 67. Channel region 69 extends to surface 58 of substrate 59 between source region 65 and lightly doped portion 68 of drain region 66. Positioned above channel region 69 is gate 70 which may be composed of polysilicon material, gate 70 being separated from the surface 58 by insulating layer 56, which extends across the entire surface 58 (excepting of course the contact areas for regions in substrate 59). Also included in combined drain resistor region 61 is heavily doped N-type guard ring region 71 which is positioned adjacent to source region 65. Source region 65 is connected to +HV at contact point 76 and although not shown in tee Figures, guard ring 71 is also connected to +HV. Included in combined drain resistor region 61 is heavily doped N-type contact region 72 which serves as the tap point for resistor 8, which is in effect incorporated in the combined drain resistor region 61. The resistive function of combined drain resistor region 61 is achieved by the portion of region 61 which generally extends from guard ring 71 to the edge of lightly N-doped portion 62 adjacent to channel region 57. The remainder of region 61 functions as a well for P-channel device 64. Metallization 73 provides electrical connection between contact region 72 and gate 70 of P-channel device 64. By reference to FIG. 5, it will be noted that we route metallization 73 in such a fashion that it is always above combined drain resistor region 61 and we thus avoid any high voltage metallization crossing of a PN junction.

Again referring to FIG. 5, high voltage pad 9 provides positive high voltage to bus 74, which in turn provides positive high voltage to combined drain resistor region 61 via contact point 75 and also positive high voltage to source region 65 and body of device 64 (consisting of combined drain resistor region 61) via contact point 76, thus completing our high voltage resistor-load inverter circuit. It will of course be appreciated that certain of the contacts illustrated in FIG. 5 are not shown in FIG. 6 in view of the way the cross section 6—6 was taken in FIG. 5. However, those skilled in the art will certainly appreciate how the appropriate connections are made to the various regions and will understand how to implement our invention as illustrated in FIGS. 5 and 6.

Referring to FIG. 5, it will be noted that we also provide polysilicon shield 77 which rests on insulating material 56 and follows along the edge of combined drain resistor region 61. Polysilicon shield 77 is shorted to ground by metallization 77A via contact point 77B (which is at ground potential) and contact point 77C which connects metallization 77A to polysilicon shield 77.

An alternative resistor load inverter circuit in accordance with our invention may be produced without the use of channel region 57. For example, although not illustrated in FIG. 6, combined drain resistor region 61 may be formed in substrate 59 such that the lefthand edge (as viewed in FIG. 6) of lightly N-doped portion 62 of combined drain resistor region 61 abuts the righthand edge (as viewed in FIG. 6) of body region 50, thus eliminating channel region 57. With this alternative configuration, the polysilicon gate for N-channel transistor 51 need only extend above channel region 60 in P-type body region 50. Except for these two changes, the remaining portions of this alternative resistor load inverter circuit would be the same as illustrated in FIG. 6.

Figure 6A:
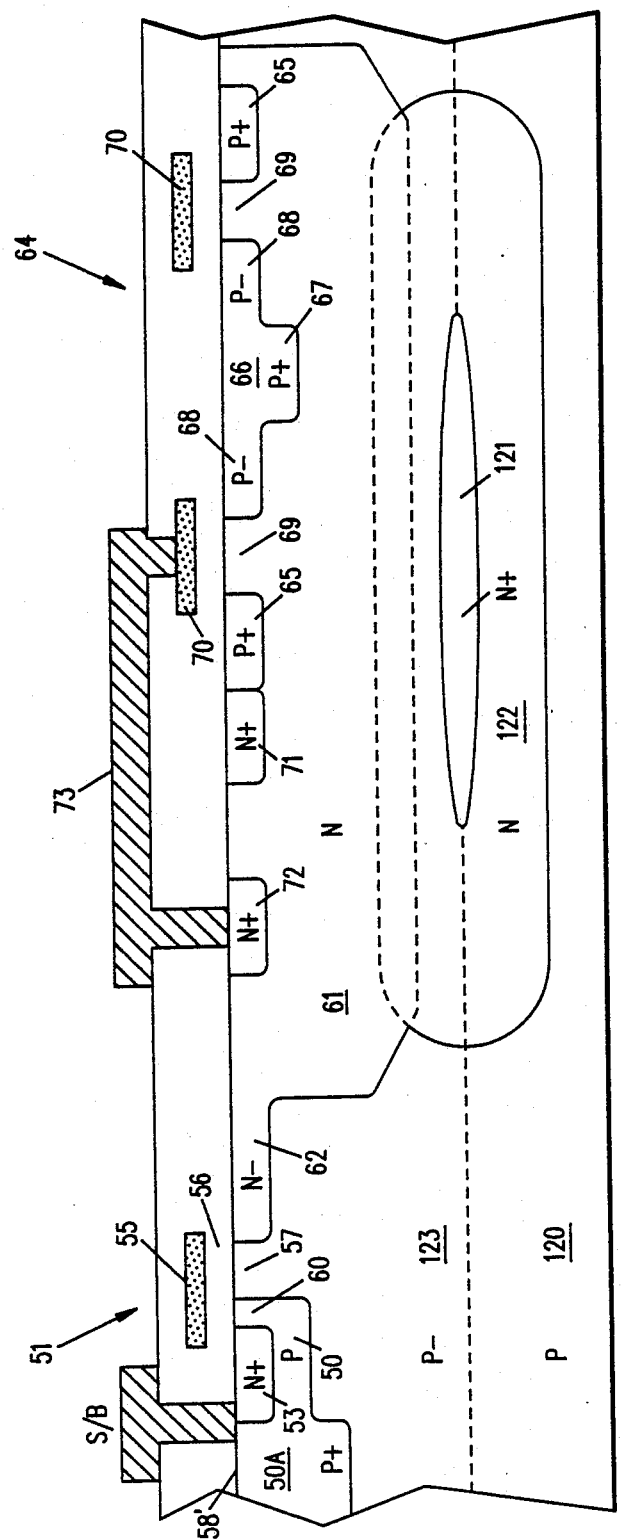
FIG. 6A illustrates a second embodiment of our invention.

The second embodiment of our invention utilizes an up-down N-well. This embodiment is illustrated in FIG. 6A, where it will be observed that like reference characters are used for items common with those in FIG. 6. Our device in FIG. 6A is constructed beginning with P-type substrate 120, having a resistivity of about twelve to fifty ohm-cm. Substrate 120 is masked and has antimony diffused into its surface to form highly N-doped buried layer 121 with a dopant concentration after drive-in of approximately $1 \times 10^{15}$ atoms/cm$^3$. Diffusion of phosphorus into the surface of substrate 120 forms N-doped region 122. The preferred concentration of phosphorus after drive-in is $1 \times 10^{12}$ atoms/cm$^3$. Next, epitaxial layer 123 is formed on the surface of substrate 120 to a thickness of about fifteen microns After drive-in, the slow diffusing antimony in buried layer 121 diffuses very little into substrate 120 and into epitaxial layer 123, while the more rapidly diffusing phosphorus dopant diffuses a much greater distance into both substrate 120 and epitaxial layer 123. The rapid diffusion of phosphorus from surface 58' of epitaxial layer 123 in forming combined drain resistor region 61 causes a portion of combined drain resistor region 61 to overlap the upper portion of N-doped region 122 forming what is called an up-down diffusion. This structure provides increased breakdown voltage for device 64.

Figure 7:
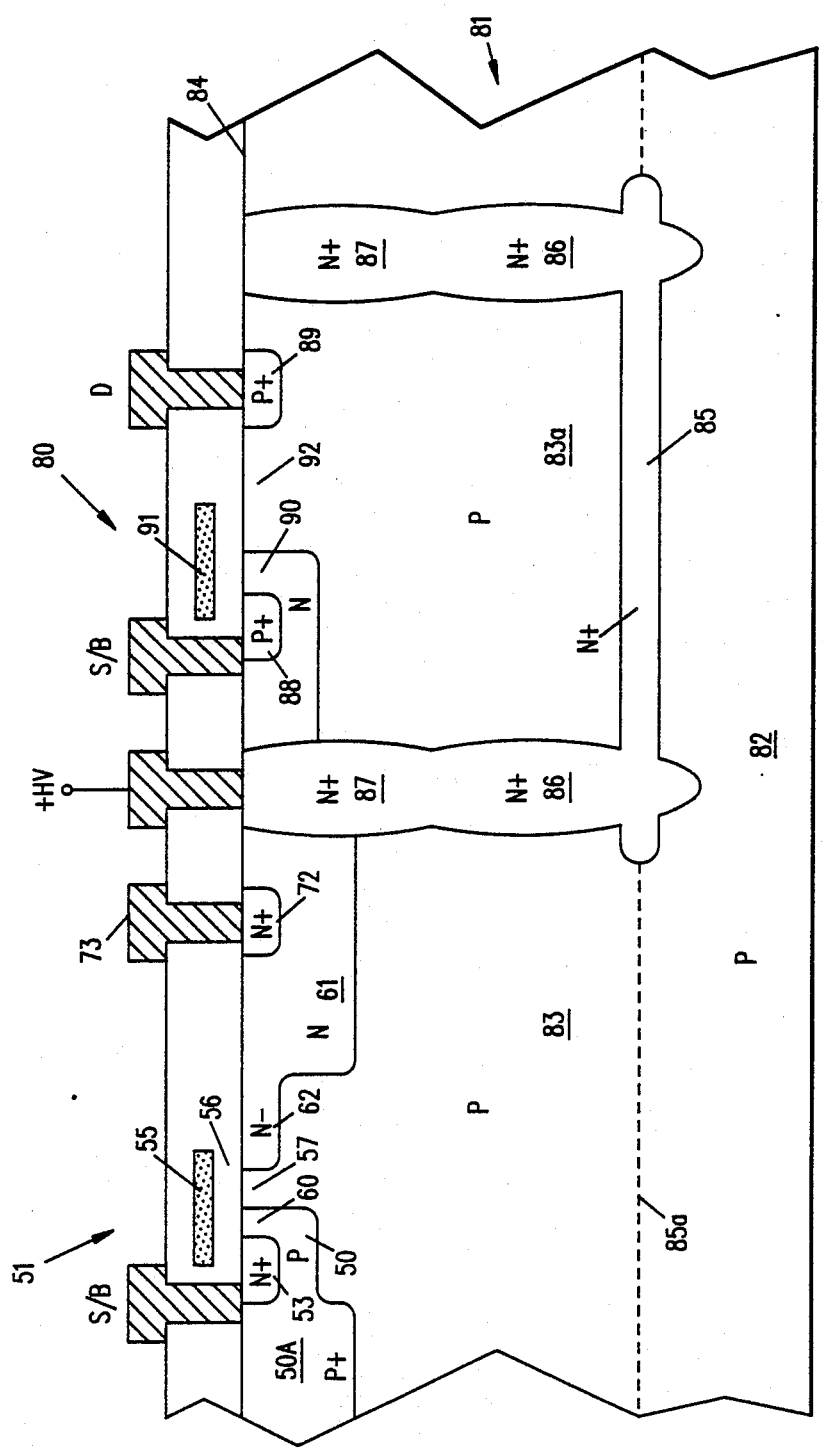
FIG. 7 illustrates a third embodiment of our invention.

The third embodiment of our invention is illustrated in FIG. 7. FIG. 7 is a cross section of a device which incorporates P-channel double diffused MOS transistor 80 as the P-channel device in our resistor-load inverter circuit. Our resistor-load inverter device 81 comprises substrate 82 of P-type material and an epitaxial layer 83, also of P-type material, grown by the epitaxial process well known to those skilled in the art. The dashed line identified by reference character 85a indicates the upper surface of substrate 82 as well as the junction between substrate 82 and epitaxial layer 83. The upper surface of epitaxial region 83 is denoted by reference 84. For the purposes of illustration, region 83 is not shown to scale and is shown in exaggerated depth so that the regions incorporated therein may be shown more clearly. In producing device 81, an N-type dopant, such as arsenic, is introduced into substrate 82 prior to the growth of epitaxial layer 83, the result of which is the development of buried layer 85 which is heavily doped N-type material. Isolation regions 86 are produced at the ends of buried layer 85 by the introduction of phosphorus into a ring surrounding buried layer 85. After the growth of P-type epitaxial layer 83 the phosphorus diffused in the ring around buried layer 85 diffuses upward forming isolation regions 86. Similarly, after completion of epitaxial region 83, phosphorus is diffused into epitaxial layer 83 from surface 84 directly above isolation region 86 and diffuses downward into epitaxial layer 83 forming isolation region 87 which merges with isolation region 86 directly therebelow. To those skilled in the art, this will be recognized as the up-down isolation process. Buried layer 85 in conjunction with isolation regions 86 and 87 form tub region 83a which, as will be described below, will be used for P-channel DMOS transistor 80. Following the creation of the isolation regions, the next step in producing device 81 is to mask surface 84 and through the well known diffusion process produce P-doped body region 50, heavily P-doped deep body region 50A, which is followed by a second masking to produce combined drain resistor region 61. Thereafter, heavily N-doped source region 53 and contact region 72 are formed by the diffusion process. Next, heavily P-doped source region 88 and drain contact region 89 are produced by diffusion into combined drain resistor region 61 and epitaxial region 83, respectively. That portion of tub region 83a which remains after formation of source region 88 and the portion of combined drain resistor region 61 which extends into tub region 83a serves as the drain for P-channel transistor 80. The varying diffusion between source region 88 and combined drain resistor region 61 produces channel region 90, above which is provided gate 91 which extends across channel region 90 and partially into region 92 which extends between drain contact region 89 and the rightmost edge of channel region 90. As an alternative to the foregoing, we have found that a satisfactory resistor-load inverter device may be constructed without utilizing a buried layer. For such an embodiment, we utilized an N-type substrate instead of P-type substrate 82, and accordingly the need for buried layer 85 was eliminated. The remaining construction and operation of the device was the same as that described above with respect to device 81. Another alternative construction to our third embodiment involves eliminating channel 57 in epitaxial layer 83. The changes to accomplish elimination of channel 57 are the same as those described previously with respect to our first embodiment and the description thereof will not be repeated here.

The layout of our third embodiment follows the methodology used for our first embodiment in FIG. 5. We position P-channel DMOS transistor 80 in the same relationship as PMOS device 64 in FIG. 5, however, our positive high voltage connection to combined drain resistor region 61 for the second embodiment is made to through isolation region 87, rather than directly to combined drain resistor region 61 as done in our first embodiment. Accordingly, contact point 75 of the first embodiment (illustrated in FIG. 5) would be arranged such that it touches the upper surface of isolation region 87 where it merges with surface 84 of device 81. Although not illustrated in FIG. 7, gate 91 of device 80 would be electrically connected to metallization 73, which would be routed in the manner illustrated in FIG. 5. From the foregoing it will be appreciated that we have again avoided having a high voltage metallization cross a PN junction and accordingly eliminated the high voltage breakdown problem encountered with prior art devices.

Following the teachings of our invention, tub region 83a in FIG. 7 may be utilized for low voltage or analog circuits using NMOS,CMOS or bipolar devices in tub region 83a. In such an embodiment, low voltage/analog circuits would be utilized instead of DMOS transistor 80 and the resulting semiconductor device would combine high voltage N-channel transistor 51 with low voltage/analog circuits in tub region 83a.

Figure 7A:
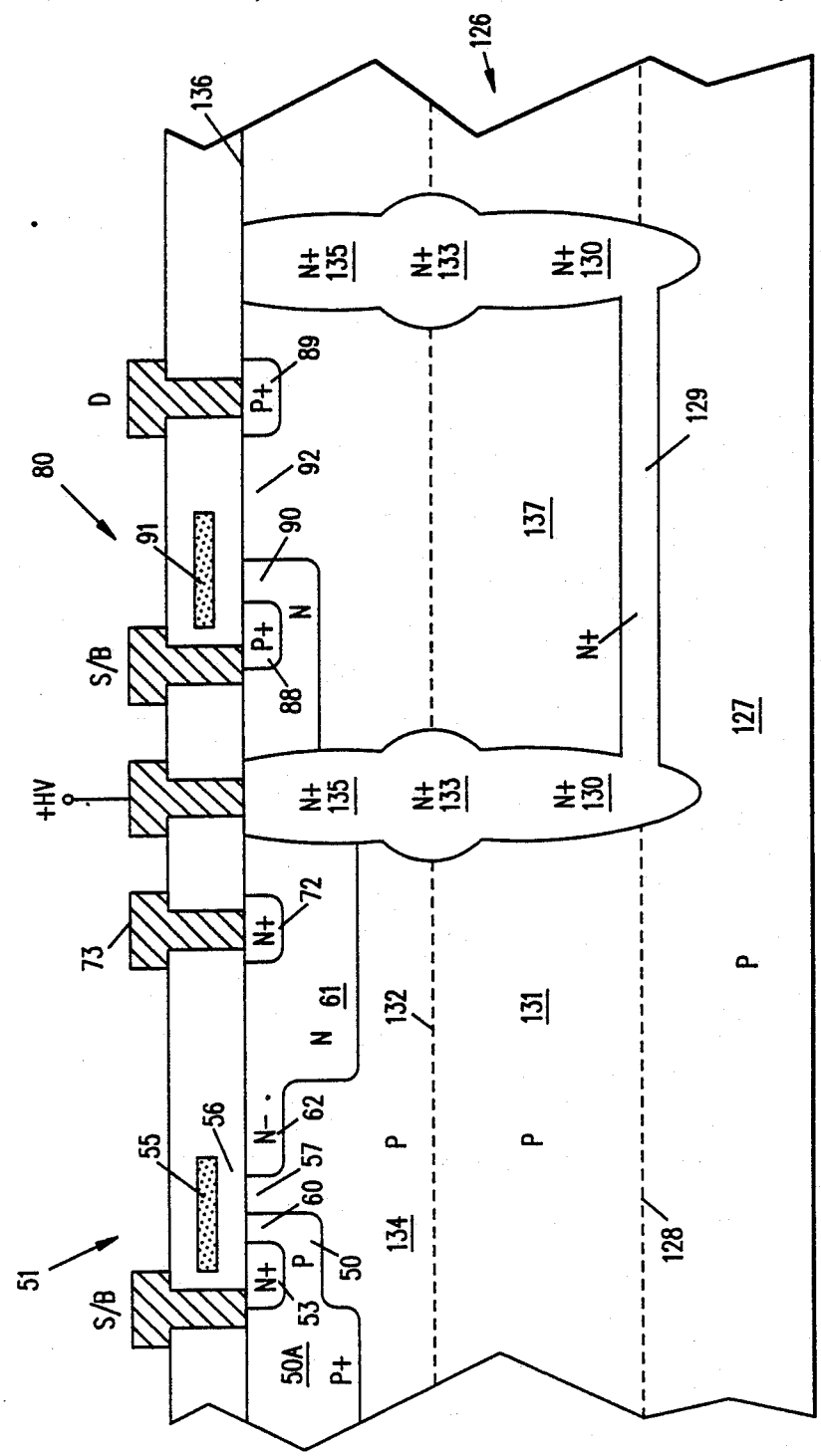
FIG. 7A illustrates a fourth embodiment of our invention.

The fourth embodiment of our invention is illustrated in FIG. 7A where resistor load level shift device 126 is shown in cross-section. Device 126 is comprised of substrate 127 of P-type material having an upper surface 128. Surface 128, after masking by well known techniques, had antimony diffused therein to form highly doped N-type buried layer 129, having a doping concentration after drive-in of approximately $1 \times 10^{15}$ atoms/cm$^3$. Following the formation of buried layer 129, a second mask was used to create up N-wells (or alternatively up isolation region) 130 at the opposite ends of buried layer 129. N-wells 130 were produced by diffusion of phosphorus into surface 128. We have found that the preferred doping concentration of phosphorus in N-wells 130 is approximately $1 \times 10^{12}$ atoms/cm$^3$. First epitaxial layer 131 of P-type material is formed on surface 128 to a thickness of approximately fifteen microns and its surface 132 is masked (by conventional techniques). Openings are produced in the mask directly above N-wells 130 and phosphorus is diffused into such openings to produce middle-wells (or middle isolation region) 133 of highly N-doped material having a doping concentration approximately the same as up N-wells 130. Next, second epitaxial layer 134 of P-type material is formed on surface 132 of first epitaxial layer 130 and grown to a thickness of approximately fifteen microns. Down wells (or down isolation region) 135 of highly N-doped material are produced by masking surface 136 of second epitaxial layer 134 and diffusing phosphorus into openings established in the mask directly above middle wells 133. The preferred doping concentration for down wells 135 is the same as that for wells 130 and 133. Since phosphorus is a relatively rapidly diffusing dopant, as compared to antimony, for example, wells 130, 133 and 135 merge into what is called an up-middle-down isolation region. Since antimony diffuses more slowly than phosphorus, buried layer 129 diffuses a lesser distance into substrate 127 and first epitaxial layer 130 than does the phosphorus diffused into substrate 127, which results in the configuration illustrated in FIG. 7A. The up-middle-down isolation regions in conjunction with buried layer 129 form tub 137 in first and second epitaxial layers 130 and 134, respectively, for P-channel device 80 which is formed in the manner described above with respect to device 81 (of FIG. 7). Similarly, N-channel device 51 and the remaining portions of device 126 are produced in the same manner as their corresponding portions (denoted by the same reference characters) of device 81. Also, as pointed out above with respect to the previously described embodiments, channel region 57 may be eliminated.

Figure 8:
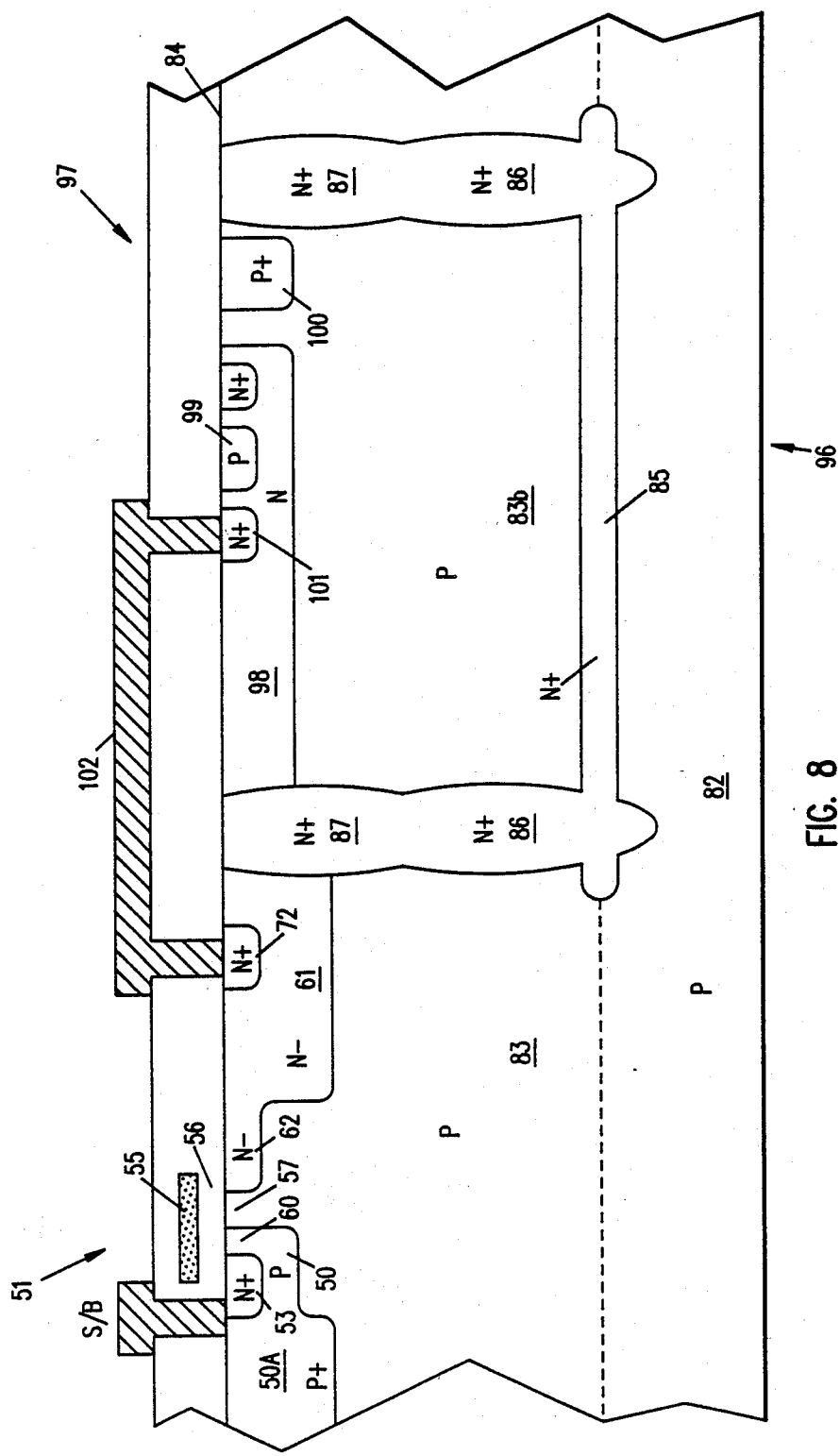
FIG. 8 illustrates a fifth embodiment of our invention including a PNP bipolar transistor.

The fifth embodiment of our invention is illustrated in FIG. 8, which shows in cross section the resistor load level shift device 96 which incorporates N-channel transistor 51, as previously described, and PNP transistor 97 which is utilized as our P-channel device rather than as in our previous embodiments P-channel PMOS device 64 or P-channel double diffused MOS transistor 80. Device 96 incorporates many of the same elements utilized in our previously described embodiments, and accordingly, common reference characters are utilized. In producing resistor load level shift device 96 we first diffused base region 98 from surface 84 into collector region 83b (bounded by buried layer 85 and isolation regions 86 and 87), then diffused into base region 98, emitter region 99, followed by the diffusion from surface 84 of collector contact 100. Finally, base contact diffusion 101 is provided to permit connection to base region 98, which in our embodiment is connected to contact region 72 in our combined drain resistor region 61 via metallization 102. Again, we follow a layout method for device 96 which is consistent with our layout in the first embodiment of FIG. 5, whereby we route metallization 102 to eliminate any high voltage crossings of a PN junction; and as we utilized with respect to second embodiment, our positive high voltage contact is made to isolation region 87, which contact is not shown in FIG. 8.

Figure 9:
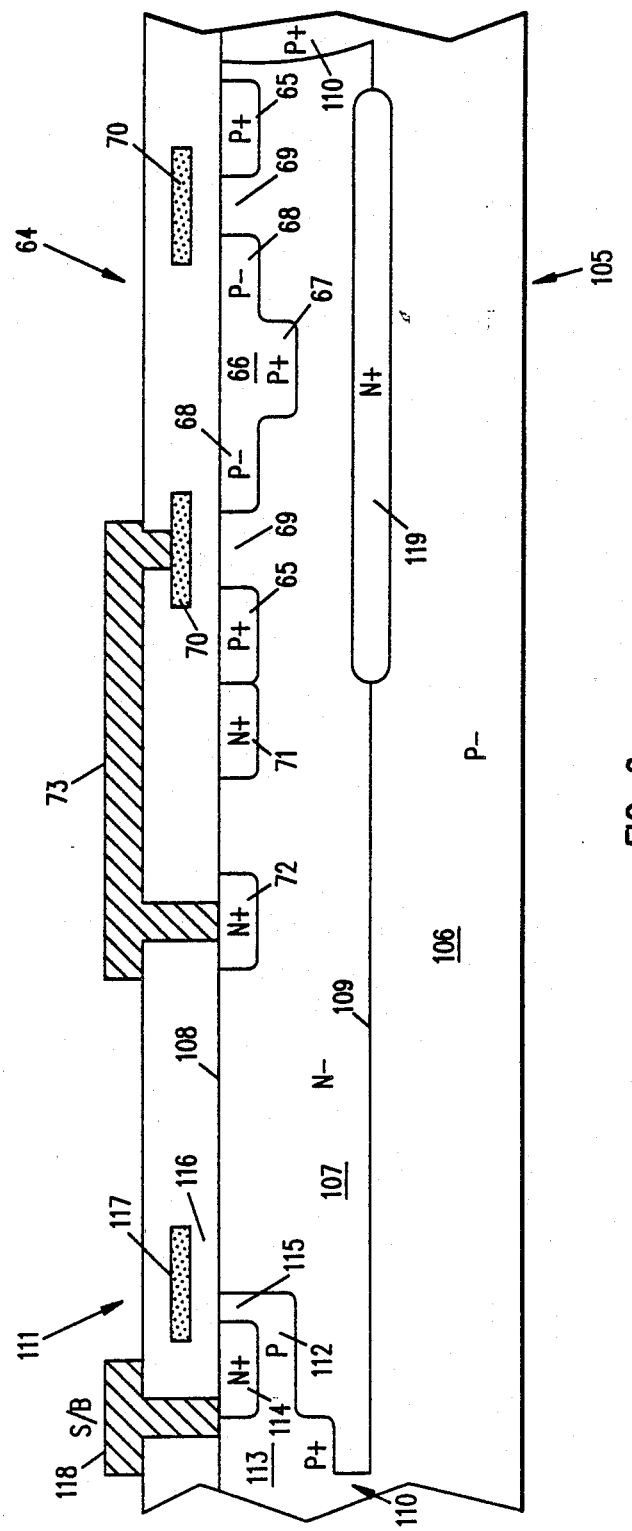
FIG. 9 illustrates a sixth embodiment of our invention.

A sixth embodiment of our invention is illustrated in FIG. 9. FIG. 9 illustrates our resistor-load inverter device 105 which utilizes a reduced surface field to provide improved high voltage performance. The concept of reduced surface field, which is frequently described in the shorthand as RESURF, has been described in technical papers, for example, the paper by J. A. Appels and H. M. J. Vaes entitled "HIGH VOLTAGE THIN LAYER DEVICES (RESURF DEVICES)", 79 International Electron Device Meeting, Paper No. 10.1, pp. 238–241. As will be appreciated by reference to FIG. 9, certain portions of device 105 are common to previously described devices and accordingly utilize the same reference character. Also, device 105 utilizes a layout as illustrated in FIG. 5 to avoid high voltage metallization crossing a PN junction to preclude the difficulties attendant with prior art devices.

Device 105 is constructed utilizing a lightly P-doped substrate 106 exhibiting a high-ohmic characteristic, for example, with a resistivity in the range of from five ohm-cm to forty ohm-cm, and having a doping concentration in the range of from $1 \times 10^{14}$ to $1 \times 10^{15}$ atoms per cubic centimeter. Lightly N doped epitaxial layer 107 is grown through well known techniques and has a doping concentration of from $1 \times 10^{14}$ to $1 \times 10^{15}$ atoms per cubic centimeter. The upper surface of epitaxial layer 107 is indicated by reference character 108 and the junction between substrate 106 and epitaxial layer 107 by reference character 109. The preferred thickness of epitaxial layer 107, measured from upper surface 108 to junction 109, is five microns. After epitaxial layer 107 has been established on surface 109 of substrate 106, highly P-doped isolation region 110 is formed by conventional techniques utilizing a patterning step to establish the area to be doped and diffusing a P-type dopant, such as boron, from surface 108 such that isolation region 110 extends through epitaxial layer 107 and joins substrate 106. The portion of epitaxial layer 107 bounded by isolation region 110 forms a combined drain resistor region, which will be more fully described below.

P-channel device 64, which has previously been described with respect to the device discussed in FIG. 6 is then formed in the combined drain resistor region bounded by isolation region 110. It will be recalled that highly N-doped region 72 functions as the center tap for the resistor, metallization 73 being utilized to connect the center tap to gate 70 of device 64 and that the source region 65 is connected to +HV and that although not shown, guard ring 71 is also connected to +HV. P-channel device 64 is formed in the combined drain resistor region of epitaxial layer 107 in the same manner as previously described, with the regions extending into epitaxial layer 107 from surface 108. Also provided in device 105 is highly N-doped buried layer 119 which is formed below P-channel device 64 by implantation of antimony ions into substrate 106. This implantation is accomplished prior to growing of epitaxial layer 107, and results in the usual extension of buried layer 119 into epitaxial layer 107 as will be appreciated by reference to FIG. 9. Use of buried layer 119 is optional. In similar fashion, N-channel MOS transistor 111 is formed in the combined drain resistor region of epitaxial layer 107 by diffusing from surface 108 P-doped body region 112 and a highly P-doped deep body region 113 which merges with isolation region 110. Highly N-doped source region 114 is formed in body region 112 by a diffusion process from the surface 108, with the varying diffusion between source region 114 and body region 112 establishing channel region 115 which extends to surface 108. As is well known to those skilled in the art, an insulating layer 116 is formed on surface 108, which layer may be, for example, of silicon dioxide material, and gate 117, which may be composed of polysilicon material is formed on insulating layer 116 and extends above channel region 115, with the left edge of gate 117 extending above source region 114 and the rightmost portion of gate 117 extending above the left hand edge of combined drain resistor region in epitaxial layer 107. It will of course be appreciated by those skilled in the art that with this configuration N-channel MOS transistor 111 has been formed which includes source 114, channel 115, gate 117. As in our previous embodiments, the combined drain resistor region, which in device 105 is formed in epitaxial layer 107 by isolation region 110, not only serves as the drain for the N-channel device, but also functions as the resistor for resistor load inverter device 105. As is conventional with MOS transistors, source 114 and body 112 are shorted by metallization 118 which extends to surface 108 making contact with source region 114 and body region 112.

It will of course be recognized that our invention may be employed using opposite polarity devices to level shift down to a lower voltage. It is also of course understood that the scope of our invention is not determined by the foregoing description, but only by the following claims.

We claim:
1. A semiconductor device comprising:
    a substrate of first conductivity type;
    a body region of first conductivity type extending into said substrate from a surface, said body region having a doping level greater than the doping level of said substrate;
    a source region of second conductivity type extending into said body region from said surface to a depth less than said body region extends into said substrate;
    a combined drain resistor voltage divider region of second conductivity type extending into said substrate from said surface, said combined drain resistor voltage divider region having a first portion positioned adjacent to said body region and functioning as a drain region for said source region of second conductivity type, and a second portion positioned away from said body region;
    a first contact region of second conductivity type extending into said second portion of said combined drain resistor voltage divider region from said surface to permit connection to an electrical potential;
    a second contact region of second conductivity type extending into said combined drain resistor voltage divider region from said surface and being positioned between said first contact region and the edge of said combined drain resistor voltage divider region adjacent to said body region, said second contact region providing an electrical potential which is a function of the position of said second contact region with respect to said first contact region and the current flow in said combined drain resistor voltage divider region, whereby during operation of the semiconductor device the electrical potential provided by said second contact region has a magnitude which is between the electrical potential of said source region of second conductivity type and the electrical potential of said first contact region;
    a channel region in said substrate extending to said surface between said combined drain resistor voltage divider region and said body region, a channel region in said body region extending to said surface between said source region and said channel region in said substrate;

an insulating material on said surface and extending from said source region to said combined drain resistor voltage divider region; and
a gate on said insulating material, said gate being positioned above said channel region in said body region and said channel region in said substrate.

2. The device of claim 1, wherein the part of said first portion of said combined drain resistor voltage divider region adjacent to said channel region in said substrate extends into said substrate to a first depth and said second portion of said combined drain resistor voltage divider region extends into said substrate to a second depth greater than said first depth.

3. The device of claim 2, including a source region of first conductivity type extending into said second portion of said combined drain resistor voltage divider region from said surface, a drain region of first conductivity type extending into said second portion of said combined drain resistor voltage divider region from said surface and being positioned adjacent to said source region of first conductivity type, a channel region in said second portion of said combined drain resistor voltage divider region extending to said surface between said source region of first conductivity type and said drain region of first conductivity type, an insulating material on said surface above said channel region in said second portion of said combined drain resistor voltage divider region, and a gate on said insulating material above said channel region in said second portion of said combined drain resistor voltage divider region.

4. The divider of claim 3, including means electrically connecting said second contact region to said gate positioned above said channel region in said second portion of said combined drain resistor voltage divider region.

5. A semiconductor device comprising:
a substrate of first conductivity type;
an epitaxial layer of material of first conductivity type on said substrate;
a body region of first conductivity type extending into said epitaxial layer from a surface, said body region having a doping level greater than the doping level of said epitaxial layer;
a source region of second conductivity type extending into said body region from said surface to a depth less than said body region extends into said epitaxial layer;
a combined drain resistor region of second conductivity type extending into said epitaxial layer from said surface and being positioned adjacent to said body region, said combined drain resistor region functioning as a drain region for said device and as a resistive region;
a channel region in said epitaxial layer extending to said surface between said combined drain resistor region and said body region, a channel region in said body region extending to said surface between said source region and said channel region in said epitaxial layer;
an insulating material on said surface extending from said source region to said combined drain resistor region;
an insulating material on said surface extending from said source region to said combined drain resistor region;
a first gate on said insulating material, said first gate being positioned above said channel region in said body region and said channel region in said epitaxial layer;
a first isolation region of second conductivity type extending from said surface through said combined drain resistor region and into said epitaxial layer;
a buried layer of second conductivity type positioned below said first isolation region;
a second isolation region of second conductivity type extending from said buried layer to and merging with said first isolation region thereby forming a drain region in said epitaxial layer surrounded by said buried layer and said first and second isolation regions;
a source region of first conductivity type extending from said surface into the portion of said combined drain resistor region surrounded by said first isolation region, said source region being positioned adjacent to one edge of said combined drain resistor region;
a channel region extending to said surface between said source region of first conductivity type and the adjacent edge of said combined drain resistor region;
an insulating material on said surface above said channel region in said combined drain resistor region; and
a second gate on said insulating material above said channel region in said combined drain resistor region.

6. The device of claim 5, including a first contact region of second conductivity type extending into said II combined drain resistor region from said surface and means electrically connecting said first contact region to said second gate.

7. The device of claim 1, wherein said combined drain resistor voltage divider region includes a source region of first conductivity type extending into said combined drain resistor voltage divider region from said surface, a drain region of first conductivity type extending into said combined drain resistor voltage divider region from said surface and being positioned adjacent to said source region of first conductivity type, a channel region in said combined drain resistor voltage divider region extending to said surface between said source region of first conductivity type and said drain region of first conductivity type, an insulating material on said surface above said channel region in said combined drain resistor voltage divider region and a gate on said insulating material above said channel region in said combined drain resistor voltage divider region.

8. The device of claim 7, including means electrically connecting said second contact region to said gate positioned above said channel region in said combined drain resistor voltage divider region.

9. A semiconductor device comprising: a substrate of first conductivity type; an epitaxial layer of material of first conductivity type on said substrate;
a body region of first conductivity type extending into said epitaxial layer from a surface, said body region having a doping level greater than the doping level of said epitaxial layer;
a source region of second conductivity type extending into said body region from said surface to a depth less than said body region extends into said epitaxial layer;
a combined drain resistor region of second conductivity type extending into said epitaxial layer from said surface and being positioned adjacent to said body region, said combined drain resistor region functioning as a drain region for said device and as a resistive region;

a channel region in said epitaxial layer extending to said surface between said combined drain resistor region and said body region, a channel region in said body region extending to said surface between said source region and said channel region in said epitaxial layer;

an insulating material on said surface extending from said source region to said combined drain resistor region;

a first gate on said insulating material, said first gate being positioned above said channel region in said body region and said channel region in said epitaxial layer;

a first isolation region of second conductivity type extending from said surface through said combined drain resistor region and into said epitaxial layer;

a buried layer of second conductivity type positioned below said first isolation region;

a second isolation region of second conductivity type extending from said buried layer to and merging with said first isolation region thereby forming a collector region in said epitaxial layer surrounded by said buried layer and said first and second isolation regions;

a base region of second conductivity type extending into said collector region;

an emitter region of first conductivity type extending into said base region; and a collector contact region of first conductivity type extending into said collector region.

10. The device of claim 9, including a first contact region of second conductivity type extending into said combined drain resistor region from said surface and means electrically connecting said first contact region to said base region.

11. A semiconductor device comprising:

a substrate of first conductivity type;

an epitaxial layer of material of second conductivity type on said substrate;

a body region of second conductivity type extending into said epitaxial layer from a surface, said body region having a doping level greater than the doping level of said epitaxial layer;

a source region of first conductivity type extending into said body region from said surface to a depth less than said body region extends into said substrate;

a combined drain resistor region of first conductivity type extending into said epitaxial layer from said surface and being positioned adjacent to said body region, said combined drain resistor region functioning as a drain region for said device and as a resistive region;

a channel region in said epitaxial layer extending to said surface between said combined drain resistor region and said body region, a channel region in said body region extending to said surface between said source region and said channel region in said epitaxial layer;

an insulating material on said surface and extending from said source region to said combined drain resistor region;

a first gate on said insulating material, said gate being positioned above said channel region in said body region and said channel region in said epitaxial layer;

a source region of second conductivity type extending into said combined drain resistor region from said surface;

a drain region of second conductivity type extending into said epitaxial layer from said surface and being positioned adjacent to said source region of second conductivity type;

a drain contact region of second conductivity type extending into said drain region of second conductivity type from said surface and being positioned adjacent to said combined drain resistor region;

a drift region extending along said surface between said drain contact region and said combined drain resistor region;

a channel region extending to said surface between said source region of second conductivity type and said drift region;

an insulating material on said surface above said channel region in said combined drain resistor region;

a second gate on said insulating material above said channel region in said combined drain resistor region; and an isolation region of first conductivity type extending from said surface of said epitaxial layer into said epitaxial layer to said substrate and surrounding said source region of second conductivity type, said drain region of second conductivity type, said drift region and said channel region which extends between said source region of second conductivity type and said drift region.

12. The device of claim 11, including a contact region of second conductivity type in said combined drain resistor region and means electrically connecting said contact region to said second gate.

13. A semiconductor device comprising:

a substrate of first conductivity type;

an epitaxial layer of material of second conductivity type on said substrate;

an isolation region of first conductivity type extending from a surface of said epitaxial layer through said epitaxial layer to said substrate thereby forming a combined drain resistor region bounded by said isolation region;

a body region of first conductivity type extending into said combined drain resistor region from a surface;

a source region of second conductivity type extending into said body region from said surface to a depth less than said body region extends into said combined drain resistor region, said source region being positioned adjacent to said combined drain resistor region;

a channel region in said body region extending to said surface between said source region and said combined drain resistor region;

an insulating material on the surface of said combined drain resistor region;

a first gate on said insulating material and positioned above said channel region in said body region;

a source region of first conductivity type extending into said combined drain resistor region from said surface;

a drain region of first conductivity type extending into said combined drain resistor region adjacent to said source region;

a channel region in said combined drain resistor region and extending to said surface between said source region of first conductivity type and said drain region of first conductivity type;

an insulating material on said surface above said channel region in said combined drain resistor region;

a second gate on said insulating material above said channel region in said combined drain resistor region;

a contact region of second conductivity type extending into said combined drain resistor region; and means electrically connecting said contact region and said second gate.

14. The device of claim 13, wherein said drain region includes a first portion adjacent to said channel region in said combined drain resistor, said first portion having a first doping concentration and extending into said combined drain resistor region to a first depth, and said drain region including a second, thicker portion positioned away from said channel region, with said second portion having a doping concentration greater than said first portion.

15. The semiconductor device of claim 13, wherein the doping concentration of said combined drain resistor region is in the range of from $1 \times 10^{14}$ atoms per cubic centimeter to $1 \times 10^{15}$ atoms per cubic centimeter.

16. The semiconductor device of claim 15, wherein the doping concentration of said substrate is in the range of from $1 \times 10^{14}$ atoms per cubic centimeter to $1 \times 10^{15}$ atoms per cubic centimeter and the resistivity of said substrate is in the range of from five ohm-cm to forty ohm-cm.

17. The semiconductor device of claim 14, wherein the doping concentration of said combined drain resistor region is in the range of from $1 \times 10^{14}$ atoms per cubic centimeter to $1 \times 10^{15}$ atoms per cubic centimeter.

18. The semiconductor device of claim 17, wherein the doping concentration of said substrate is in the range of from $1 \times 10^{14}$ atoms per cubic centimeter to $1 \times 10^{15}$ atoms per cubic centimeter and the resistivity of said substrate is in the range of from five ohm-cm to forty ohm-cm.

19. The semiconductor device of any of claims 13–18, including a buried layer of material of second conductivity type, said buried layer being positioned below said source region of first conductivity type, said drain region of first conductivity type and said channel region in said combined drain resistor region.

20. A semiconductor device comprising:
a substrate of first conductivity type;
a body region of first conductivity type extending into said substrate from a surface, said body region having a doping level greater than the doping level of said substrate;
a source region of said conductivity type extending into said body region from said surface to a depth less than said body region extends into said substrate;
a combined drain resistor voltage divider region of second conductivity type extending into said substrate from said surface said combined drain resistor voltage divider region having a first positioned adjacent to said body region and functioning as a drain region for said source region of second conductivity type, and a second portion positioned away from said body region;
a first contact region of second conductivity type extending into said second portion of said combined drain resistor voltage divider region from said surface to permit connection to an electrical potential;
a second contact region of second conductivity type extending into said combined drain resistor voltage divider region from said surface and being positioned between said first contact region and the edge of said combined drain resistor voltage divider region adjacent to said body region, said second contact region providing an electrical potential which is a function of the position of said second contact region with respect to said first contact region and the current flow in said combined drain resistor voltage divider region, whereby during operation of the semiconductor device the electrical potential provided by said second contact region has a magnitude which is between the electrical potential of said source region of second conductivity type and the electrical potential of said first contact region;
a channel region in said body region extending to said surface between said source region and said combined drain resistor voltage divider region;
an insulating material on said surface above said channel region in said body region; and
a gate on said insulating material, said gate being positioned above said channel region in said body region.

21. The device of claim 20, wherein the part of said first portion of said combined drain resistor voltage divider region adjacent to said channel region in said body region extends into said substrate to a first depth and said second portion of said combined drain resistor voltage divider region extends into said substrate to a second depth greater than said first depth.

22. The device of claim 21, including a source region of first conductivity type extending into said second portion of said combined drain resistor voltage divider region from said surface, a drain region of first conductivity type extending into said second portion of said combined drain resistor voltage divider region from said surface and being positioned adjacent to said source region of first conductivity type, a channel region in said second portion of said combined drain resistor voltage divider region extending to said surface between said source region of first conductivity type and said drain region of first conductivity type, an insulating material on said surface above said channel region in said second portion of said combined drain resistor voltage divider region, and a gate on said insulating material above said channel region in said second portion of said combined drain resistor voltage divider region.

23. The device of claim 22, including means electrically connecting said second contact region to said gate positioned above said channel region in said second portion of said combined drain resistor voltage divider region.

24. The device of claim 20, wherein said combined drain resistor voltage divider region includes a source region of first conductivity type extending into said combined drain resistor voltage divider region from said surface, a drain region of first conductivity type extending into said combined drain resistor voltage divider region from said surface and being positioned adjacent to said source region of first conductivity type, a channel region in said combined drain resistor voltage divider region extending to said surface between said source region of first conductivity type and said drain region of first conductivity type, an insulating material on said surface above said channel region in said combined drain resistor voltage divider region and a gate on said insulating material above said channel region in said combined drain resistor voltage divider region.

25. The device of claim 24, including means electrically connecting said second contact region to said gate positioned above said channel region in said combined drain resistor voltage divider region.

26. A semiconductor device comprising:
a substrate of first conductivity type;
an epitaxial layer of material of first conductivity type on said substrate;
a body region of first conductivity type extending into said epitaxial layer from a surface, said body region having a doping level greater than the doping level of said epitaxial layer;
a source region of second conductivity type extending into said body region from said surface to a depth less than said body region extends into said epitaxial layer;
a combined drain resistor voltage divider region of second conductivity type extending into said epitaxial layer from said surface, said combined drain resistor voltage divider region having a first portion positioned adjacent to said body region and functioning as a drain region for said source region of second conductivity type, and a second portion positioned away from said body region;
a first contact region of second conductivity type extending into said second portion of said combined drain resistor voltage divider region from said surface to permit connection to an electrical potential;
a second contact region of second conductivity type extending into said combined drain resistor voltage divider region from said surface and being positioned between said first contact region and the edge of said combined drain resistor voltage divider region adjacent to said body region, said second contact region providing an electrical potential which is a function of the position of said second contact region with respect to said first contact region and the current flow in said combined drain resistor voltage divider region, whereby during operation of the semiconductor device the electrical potential provided by said second contact region has a magnitude which is between the electrical potential of said source region of second conductivity type and the electrical potential of said first contact region;
a heavily doped buried layer of second conductivity type formed within said substrate and said epitaxial layer;
a well region of second conductivity type formed within said substrate and said epitaxial layer and encompassing said buried layer, said well region extending into said epitaxial layer to a distance such that it merges with said combined drain resistor voltage divider region;
a channel region in said epitaxial layer extending to said surface between said combined drain resistor voltage divider region and said body region, a channel region in said body region extending to said surface between said source region and said channel region in said epitaxial an insulating material on said surface and extending from said source region to said combined drain resistor voltage divider region; and
a gate on said insulating material, said gate being positioned above said channel region in said body region and said channel region in said epitaxial layer.

27. The device of claim 26, wherein the part of said first portion of said combined drain resistor voltage divider region adjacent to said channel region in said epitaxial layer extends into said epitaxial layer to a first depth and said second portion of said combined drain resistor voltage divider region extends into said epitaxial layer to a second depth greater than said first depth.

28. The device of claim 27, including a source region of first conductivity type extending into said second portion of said combined drain resistor voltage divider region from said surface, a drain region of first conductivity type extending into said second portion of said combined drain resistor voltage divider region from said surface and being positioned adjacent to said source region of first conductivity type, a channel region in said second portion of said combined drain resistor voltage divider region extending to said surface between said source region of first conductivity type and said drain region of first conductivity type, an insulating material on said surface above said channel region in said second portion of said combined drain resistor voltage divider region, and a gate of said insulating material above said channel region in said second portion of said combined drain resistor voltage divider region.

29. The device of claim 28, including means electrically connecting said second contact region to said gate positioned above said channel region in said second portion of said combined drain resistor voltage divider region.

30. A semiconductor device comprising:
a substrate of first conductivity type;
an epitaxial layer of material of first conductivity type on said substrate;
a body region of first conductivity type extending into said epitaxial layer from a surface, said body region having a doping level greater than the doping level of said epitaxial layer;
a source region of second conductivity type extending into said body region from said surface to a depth less than said body region extends into said epitaxial layer;
a combined drain resistor voltage divider region of second conductivity type extending into said epitaxial layer from said surface, said combined drain resistor voltage divider region having a first portion positioned adjacent to said body region and functioning as a drain region for said source region of second conductivity type, and a second portion positioned away from said body region;
a first contact region of second conductivity type extending into said second portion of said combined drain resistor voltage divider region from said surface to permit connection to an electrical potential;
a second contact region of second conductivity type extending into said combined drain resistor voltage divider region from said surface and being positioned between said first contact region and the edge of said combined drain resistor voltage divider region adjacent to said body region, said second contact region providing an electrical potential which is a function of the position of said second contact region with respect to said first contact region and the current flow in said combined drain resistor voltage divider region, whereby during operation of the semiconductor device the electrical potential provided by said second contact region has a magnitude which is between the electrical potential of said source region of second conductivity type and the electrical potential of said first contact region;

a heavily doped buried layer of second conductivity type formed within said substrate and said epitaxial layer;

a well region of second conductivity type formed within said substrate and said epitaxial layer and encompassing said buried layer, said well region extending into said epitaxial layer to a distance such that it merges with said combined drain resistor voltage divider region;

a channel region in said body region extending to said surface between said source region and said combined drain resistor voltage divider region;

an insulating material on said surface above said channel region in said body;

a gate on said insulating material, said gate being positioned above said channel region in said body region.

31. The device of claim 30, wherein the part of said first portion of said combined drain resistor voltage divider region adjacent to said channel region in said body region extends into said epitaxial layer to a first depth and said second portion of said combined drain resistor voltage divider region extends into said epitaxial layer to a second depth greater than said first depth.

32. The device of claim 31, including a source region of first conductivity type extending into said second portion of said combined drain resistor voltage divider region from said surface, a drain region of first conductivity type extending into said second portion of said combined drain resistor voltage divider region from said surface and being positioned adjacent to said source region of first conductivity type, a channel region in said second portion of said combined drain resistor voltage divider region extending to said surface between said source region of first conductivity type and said drain region of first conductivity type, an insulating material on said surface above said channel region in said second portion of said combined drain resistor voltage divider region, and a gate on said insulating material above said channel region in said second portion of said combined drain resistor voltage divider region.

33. The device of claim 32, including means electrically connecting said second contact region to said gate positioned above said channel region in said second portion of said combined drain resistor voltage divider region.

34. A semiconductor device comprising:
a substrate of first conductivity type;
an epitaxial layer of material of first conductivity type on said substrate;
a body region of first conductivity type extending into said epitaxial layer from a surface, said body region having a doping level greater than the doping level of said epitaxial layer;
a source region of second conductivity type extending into said body region from said surface to a depth less than said body region extends into said epitaxial layer;
a combined drain resistor region of second conductivity type extending into said epitaxial layer from said surface and being positioned adjacent to said body region, said combined drain resistor region functioning as a drain region for said device and as a resistive region;
a channel region in said body region extending to said surface between said source region and said combined drain resistor region;
an insulating material on said surface above said channel region in said body region;
a first gate on said insulating material, said first gate being positioned above said channel region in said body region;
a first isolation region of second conductivity type extending from said surface through said combined drain resistor region and into said epitaxial layer;
a buried layer of second conductivity type positioned below said first isolation region;
a second isolation region of second conductivity type extending from said buried layer to and merging with said first isolation region thereby forming a drain region in said epitaxial layer surrounded by said buried layer and said first and second isolation regions;
a source region of first conductivity type extending from said surface into the portion of said combined drain resistor region surrounded by said first isolation region, said source region being positioned adjacent to one edge of said combined drain resistor region;
a channel region extending to said surface between said source region of first conductivity type and the adjacent edge of said combined drain resistor region;
an insulating material on said surface above said channel region in said combined drain resistor region; and
a second gate on said insulating material above said channel region in said combined drain resistor region.

35. The device of claim 34, including a first contact region of second conductivity type extending into said combined drain resistor region from said surface and means electrically connecting said first contact region to said second gate.

36. A semiconductor device comprising:
a substrate of first conductivity type;
a first epitaxial layer of material of first conductivity type on said substrate;
a second epitaxial layer of material of first conductivity type on said first epitaxial layer;
a body region of first conductivity type extending into said second epitaxial layer from a surface, said body region having a doping level greater than the doping level of said second epitaxial layer;
a source region of second conductivity type extending into said body region from said surface to a depth less than said body region extends into said second epitaxial layer;
a combined drain resistor region of second conductivity type extending into said second epitaxial layer from said surface and being positioned adjacent to said body region, said combined drain resistor region functioning as a drain region for said device and as a resistive region;

a channel region in said second epitaxial layer extending to said surface between said combined drain resistor region and said body region;

a channel region in said body region extending to said surface between said source region and said channel region in said second epitaxial layer;

an insulating material on said surface extending from said source region to said combined drain resistor region;

a first gate on said insulating material, said first gate being positioned above said channel region in said body region and said channel region in said second epitaxial layer;

a first isolation region of second conductivity type extending from said surface through said combined drain resistor region and into said second epitaxial layer;

a buried layer of second conductivity type positioned below said first isolation region, said buried layer extending into said substrate and into said first epitaxial layer;

a second isolation region of second conductivity type extending from said buried layer into said first epitaxial layer for a distance less than the thickness of said second epitaxial layer;

a third isolation region of second conductivity type having a first portion extending into said first epitaxial layer and merging with said second isolation region and having a second portion extending into said second epitaxial layer and merging with said first isolation region, thereby forming a drain region in said first and second epitaxial layers bounded by said buried layer and said first, second and third isolation regions;

a source region of first conductivity type extending from said surface into the portion of said combined drain resistor region surrounded by said first isolation region, said source region being positioned adjacent to one edge of said combined drain resistor region;

a channel region extending to said surface between said source region of first conductivity type and the adjacent edge of said combined drain resistor region; an insulating material on said surface above said channel region in said combined drain resistor region; and a second gate on said insulating material above said channel region in said combined drain resistor region.

37. The device of claim 36, including a first contact region of second conductivity type extending into said combined drain resistor region from said surface and means electrically connecting said first contact region to said second gate.

38. A semiconductor device comprising:
a substrate of first conductivity type;
a first epitaxial layer of material of first conductivity type on said substrate;
a second epitaxial layer of material of first conductivity type on said first epitaxial layer;
a body region of first conductivity type extending into said second epitaxial layer from a surface, said body region having a doping level greater than the doping level of said second epitaxial layer;
a source region of second conductivity type extending into said body region from said surface to a depth less than said body region extends into said second epitaxial layer;

a combined drain resistor region of second conductivity type extending into said second epitaxial layer from said surface and being positioned adjacent to said body region, said combined drain resistor region functioning as a drain region for said device and as a resistive region;

a channel region in said body region extending to said surface between said source region and said combined drain resistor region;

an insulating material on said surface above said channel region in said body region;

a first gate on said insulating material, said first gate being positioned above said channel region in said body region;

a first isolation region of second conductivity type extending from said surface through said combined drain resistor region and into said second epitaxial layer;

layer of second conductivity type positioned below said first isolation region, said buried layer extending into said substrate and into said first epitaxial layer;

a second isolation region of second conductivity type extending from said buried layer into said first epitaxial layer for a distance less than the thickness of said second epitaxial layer;

a third isolation region of second conductivity type having a first portion extending into said first epitaxial layer and merging with said second isolation region and having a second portion extending into said second epitaxial layer and merging with said first isolation region, thereby forming a drain region in said first and second epitaxial layers bounded by said buried layer and said first, second and third isolation regions;

a source region of first conductivity type into the portion of said extending from said surface combined drain resistor region surrounded by said first isolation region, said source region being positioned adjacent to one edge of said combined drain resistor region;

a channel region extending to said surface between said source region of first conductivity type and the adjacent edge of said combined drain resistor region;

an insulating material on said surface above said channel region in said combined drain resistor region; and a second gate on said insulating material above said channel region in said combined drain resistor region.

39. The device of claim 38, including a first contact region of second conductivity type extending into said combined drain resistor region from said surface and means electrically connecting said first contact region to said second gate.

40. A semiconductor device comprising:
a substrate of first conductivity type;
an epitaxial layer of material of first conductivity type on said substrate;
a body region of first conductivity type extending into said epitaxial layer from a surface, said body region having a doping level greater than the doping level of said epitaxial layer;
a source region of second conductivity type extending into said body region from said surface to a depth less than said body region extends into said epitaxial layer;

a combined drain resistor region of second conductivity type extending into said epitaxial layer from said surface and being positioned adjacent to said body region, said combined drain resistor region functioning as a drain region for said device and as a resistive region;

a channel region in said body region extending to said surface between said source region and said combined drain resistor region;

an insulating material on said surface above said channel region in said body region;

a first gate on said insulating material, said first gate being positioned above said channel region in said body region;

a first isolation region of second conductivity type extending from said surface through said combined drain resistor region and into said epitaxial layer;

a buried layer of second conductivity type positioned below said first isolation region;

a second isolation region of second conductivity type extending from said buried layer to and merging with said first isolation region thereby forming a collector region in said epitaxial layer surrounded by said buried layer and said first and second isolation regions;

a base region of second conductivity type extending into said collector region;

an emitter region of first conductivity type extending into said base region; and a collector contact region of first conductivity type extending into said collector region.

41. The device of claim 40, including a first contact region of second conductivity type extending into said combined drain resistor region from said surface and means electrically connecting said first contact region to said base region.

* * * * *

UNITED STATES PATENT AND TRADEMARK OFFICE
CERTIFICATE OF CORRECTION

PATENT NO. : 4,890,146
DATED : December 26, 1989
INVENTOR(S) : Williams et al.

It is certified that error appears in the above-identified patent and that said Letters Patent is hereby corrected as shown below:

Col. 13, line 4, "tee" should read --the--.
Col. 19, line 33, "divider" should read --device--.
Col. 20, line 32, delete "Il".
Col. 23, line 55, "said" should read --second--.
Col. 25, line 68, insert --layer;-- after "epitaxial".
Col. 26, line 29, "of" should read --on--.
Col. 30, line 19, insert --a buried-- before "layer".
Col. 30, line 36, after "type" insert --extending from said surface--.
Col. 30, line 37, delete "extending from said surface".

Signed and Sealed this

Twenty-fifth Day of February, 1992

Attest:

HARRY F. MANBECK, JR.

*Attesting Officer*     *Commissioner of Patents and Trademarks*